(12) United States Patent
Ortmanns et al.

(10) Patent No.: US 12,489,457 B2
(45) Date of Patent: Dec. 2, 2025

(54) CONTINUOUS-TIME DATA CONVERTER WITH DIGITAL MULTI-STAGE NOISE SHAPING SUBCONVERTER

(71) Applicant: Infineon Technologies AG, Neubiberg (DE)

(72) Inventors: Maurits Ortmanns, Ulm (DE); John G. Kauffman, Neu-Ulm (DE); Ahmed Abdelaal, Ulm (DE)

(73) Assignee: Infineon Technologies AG, Neubiberg (DE)

( * ) Notice: Subject to any disclaimer, the term of this patent is extended or adjusted under 35 U.S.C. 154(b) by 132 days.

(21) Appl. No.: 18/472,752

(22) Filed: Sep. 22, 2023

(65) Prior Publication Data

US 2025/0105856 A1 Mar. 27, 2025

(51) Int. Cl.
*H03M 3/00* (2006.01)
(52) U.S. Cl.
CPC ........... *H03M 3/352* (2013.01); *H03M 3/344* (2013.01); *H03M 3/424* (2013.01)
(58) Field of Classification Search
CPC ....... H03M 3/352; H03M 3/344; H03M 3/424
See application file for complete search history.

(56) References Cited

U.S. PATENT DOCUMENTS

| 2,927,962 | A | 3/1960 | Cutler | |
|---|---|---|---|---|
| 6,300,890 | B1 * | 10/2001 | Okuda | H03M 3/46 341/61 |
| 6,972,705 | B1 * | 12/2005 | Fei | H03M 3/39 341/172 |
| 7,183,957 | B1 * | 2/2007 | Melanson | H03F 3/217 341/143 |
| 7,420,494 | B1 * | 9/2008 | Schreier | H03M 3/42 341/143 |
| 2003/0146786 | A1 * | 8/2003 | Gulati | H03F 3/45973 330/9 |
| 2004/0032355 | A1 * | 2/2004 | Melanson | H03M 3/338 341/143 |

(Continued)

FOREIGN PATENT DOCUMENTS

EP 3641136 A1 * 4/2020 ............ H03M 3/464

OTHER PUBLICATIONS

EP3641136A1 (Year: 2020).*

(Continued)

*Primary Examiner* — Thomas D Alunkal
(74) *Attorney, Agent, or Firm* — Slater Matsil, LLP

(57) ABSTRACT

In accordance with an embodiment, a continuous-time delta-sigma analog-to-digital converter (ADC) includes: a continuous-time loop filter having an input coupled to an input of the continuous-time delta-sigma ADC; a multi-bit quantizer coupled to an output of the continuous-time loop filter; a 1-bit or 1.5 bit digital delta-sigma modulator having an input coupled to an output of the multi-bit quantizer and an output coupled to an input of the continuous-time loop filter; and a multi-bit digital delta-sigma modulator configured to requantize quantization error of the 1-bit or 1.5-bit digital delta-sigma modulator and having an output coupled to the input of the continuous-time loop filter and to an input of the 1-bit or 1.5-bit digital delta-sigma modulator.

20 Claims, 11 Drawing Sheets

(56) References Cited

U.S. PATENT DOCUMENTS

| | | | |
|---|---|---|---|
| 2006/0164276 A1* | 7/2006 | Luh | H03M 1/0668 341/155 |
| 2008/0272946 A1* | 11/2008 | Melanson | H02M 1/4225 341/172 |
| 2012/0075132 A1* | 3/2012 | Lai | H03M 3/38 341/143 |
| 2015/0171887 A1* | 6/2015 | Okuda | H03M 3/372 341/143 |
| 2018/0113534 A1* | 4/2018 | Tanaka | G06F 3/04166 |

OTHER PUBLICATIONS

Cenci, P., et al., "A 3.2mW SAR-assisted CT?? ADC with 77.5dB SNDR and 40MHz BW in 28nm CMOS", IEEE 2019 Symposium on VLSI Circuits Digest of Technical Papers, Jun. 2019, 2 pages.

Chen, Jianzhong "A Novel Noise-Shaping DAC for Multi-Bit Sigma-Delta Modulator", IEEE Transactions on Circuits and Systems—II: Express Briefs, vol. 53, No. 4, May 2006, 5 pages.

De Bock, Maarten et al., "Calibration of DAC Mismatch Errors in S? ADCs Based on a Sine-Wave Measurement", IEEE Transactions on Circuits and Systems II: Express Briefs, vol. 60, Issue 9, Sep. 2013, 5 pages.

Dong, Yunzhi et al., "A Continuous-Time 0-3 MASH ADC Achieving 88 dB DR With 53 MHz BW in 28 nm CMOS", IEEE Journal of Solid-State Circuits, vol. 49, Issue 12, Dec. 2014, 10 pages.

Hayashi, Toshio et al., "THPM 14.6: A Multistage DeltaSigma Modulator without Double Integration Loop", ISSCC 86 / Thursday, Feb. 20, 1986 / California Pavilion C, Session XIV: Voiceband Telecommunications ICs, 2 pages.

Jain, Ankesh et al., "Effective Filtering of Requantization Error in Dual Quantized CTDSM using FIR DAC", IEEE International Symposium on Circuits and Systems (ISCAS), May 26-29, 2019, 5 pages.

Kauffman, John G., et al., "An 8.5 mW Continuous-Time ?? Modulator With 25 MHz Bandwidth Using Digital Background DAC Linearization to Achieve 63.5 dB SNDR and 81 dB SFDR", IEEE Journal of Solid-State Circuits, vol. 46, Issue 12, Dec. 2011, 13 pages.

Leslie, T.C., et al., "An Improved Sigma-Delta Modulator Architecture", IEEE International Symposium on Circuits and Systems, May 1-3, 1990, US, 4 pages.

Liu, Qilong et al., "A 158-mW 360-MHz BW 68-dB DR Continuous-Time 1-1-1 Filtering MASH ADC in 40-nm CMOS", IEEE Journal of Solid-State Circuits, vol. 57, Issue 12, Dec. 2022, 13 pages.

Luo, Yanquan et al., "A High-Resolution Delta-Sigma D/A Converter Architecture with High Tolerance to DAC Mismatch", IEEE International Symposium on Circuits and Systems (ISCAS), May 27-30, 2018, 5 pages.

Maghari, N., et al., "Mixed-Order Sturdy MASH ?-S Modulator", IEEE International Symposium on Circuits and Systems, May 27-30, 2007, 4 pages.

Manivannan, Saravana et al., "A 65-nm CMOS Continuous-Time Pipeline ADC Achieving 70-dB SNDR in 100-MHz Bandwidth", IEEE Solid-State Circuits Letters, vol. 4, Apr. 8, 2021, 4 pages.

Matsuya, Yasuyuki et al., "WAM 3.5: A 16b Oversampling A/D Conversion Technology using Triple Integration Noise Shaping", ISSCC 87 / Wednesday, Feb. 25, 1987 / Trianon Ballroom ; Session III: Sampled-Data Analog Circuits, 16 pages.

O'Hare, Daniel et al., "Bandwidth Enhancement to Continuous-Time Input Pipeline ADCs", IEEE Transactions on Very Large Scale Integration (VLSI) Systems, vol. 26, Issue 2, Feb. 2018, 12 pages.

Oliaei, Omid et al., "Sigma-Delta Modulator With Spectrally Shaped Feedback", IEEE Transactions on Circuits and Systems II: Analog and Digital Signal Processing, vol. 50, Issue 9, Sep. 2003, 13 pages.

Pakniat, Hossein et al., "A ??-FIR-DAC for Multi-Bit ?? Modulators", IEEE Transactions on Circuits and Systems—I: Regular Papers, vol. 60, No. 9, Sep. 2013, 12 pages.

Qi, Liang et al., "76.6-dB-SNDR 50-MHz-BW 29.2-mW Multi-Bit CT Sturdy MASH With DAC Non-Linearity Tolerance", IEEE Journal of Solid-State Circuits, vol. 55, No. 2, Feb. 2020, 12 pages.

Witte, Pascal et al., "Background DAC Error Estimation Using a Pseudo Random Noise Based Correlation Technique for Sigma-Delta Analog-to-Digital Converters", IEEE Transactions on Circuits and Systems I: Regular Papers, vol. 57, Issue 7, Jul. 2010, 13 pages.

Shettigar, Pradeep et al., "Design Techniques for Wideband Single-Bit Continuous-Time ?? Modulators With FIR Feedback DACs", IEEE Journal of Solid-State Circuits, vol. 47, No. 12, Dec. 2012, 15 pages.

Shibata, Hajime et al., "An 800MHz-BW VCO-Based Continuous-Time Pipelined ADC with Inherent Anti-Aliasing and On-Chip Digital Reconstruction Filter", ISSCC 2020 / SESSION 16 / NYQUIST & VCO-BASED ADCs / 16.6, Feb. 16-20, 2020, 3 pages.

Shibata, Hajime et al., "A 9-GS/s 1.125-GHz BW Oversampling Continuous-Time Pipeline ADC Achieving-164-dBFS/Hz NSD", IEEE Journal of Solid-State Circuits, vol. 52, Issue 12, Dec. 2017, 16 pages.

Su, David K., et al., "FA 14.3: A CMOS Oversampling DIA Converter with a Current-Mode Semi-Digital Reconstruction Filter", ISSCC 93 / Session 14, Oversampled Converters / Paper FA 14.3, Feb. 24-26, 1993, 2 pages.

* cited by examiner

CONTINUOUS-TIME DATA CONVERTER WITH DIGITAL MULTI-STAGE NOISE SHAPING SUBCONVERTER

TECHNICAL FIELD

The present invention relates generally to a system and method for an analog-to-digital converter, and, in particular embodiments, to a system and method for a continuous-time data converter with digital multi-stage noise shaping subconverter.

BACKGROUND

Analog-to-digital converters (ADCs) are essential components in many electronic systems, enabling real-world analog signals such as audio, voltage measurements, or current readings to be converted into digital data for processing. There are various architectures used for ADC designs, with different trade-offs in speed, resolution, and complexity. Some common ADC architectures like delta-sigma converters and pipelined ADCs incorporate digital-to-analog converters (DACs) as part of their structure. While the use of these DACs may enable high performance operation for these converters, non-linearities of these DACs may present various design challenges.

Delta-sigma ADCs are commonly used in many electronic applications due to their good signal to noise and distortion ratio (SNDR) and their relaxed performance requirements on analog circuits. A delta-sigma ADC includes a delta-sigma modulator (DSM), which includes a loop filter followed by a quantizer and a digital-to-analog converter (DAC) arranged in a feedback loop. The DSM is oversampled by a sufficiently high oversampling ratio, such that the quantization noise generated by the quantizer is pushed to higher out of band frequencies by the action of the feedback loop, which leaves a very high dynamic range for the in-band signal. In many applications, the higher frequency quantization noise is digitally filtered and the high sampling rate of the data output by the modulator is reduced using a decimation filter.

Although DSMs can attain high signal-quantization-noise-ratios (SQNRs) in the in-band with low-resolution internal quantization and single-bit quantizers, this method poses difficulties for wideband applications where a constraint exists on the oversampling ratio. Hence, a multi-bit quantizer may be adopted, which offers benefits such as lower quantization noise, a more aggressive noise shaping, a larger maximum stable amplitude, rejection of clock jitter, and increased power efficiency.

However, the use of multi-bit quantization may degrade the linearity of the DSM due to non-linearities of a multi-bit DAC in the feedback loop of the DSM. Nonlinearity issues arising from element mismatch can be mitigated by enlarging the circuit area, which may lead to higher power consumption and parasitic capacitance loading. Calibration, dynamic element matching (DEM), and data-weighted-averaging (DWA) have been proposed to address these issues, but they also come with drawbacks like increased area and power consumption or reduced effectiveness at lower oversampling ratios.

Pipelined ADC architectures break the conversion process into multiple low-resolution stages. Each stage includes a sub-ADC that converts the input of each stage from the analog-domain to the digital domain, and a sub-DAC that converts the digitized output of each stage back to the analog domain. This analog-domain converted signal is then subtracted from the input to form a residue that is passed to the next stage. By dividing the conversion into many low-resolution stages, pipelined ADCs can achieve high aggregate sample rates in an efficient manner. Moreover, pipelined ADC architectures have the ability to correct for errors made by the sub-ADC.

A key challenge with pipelined ADCs is correcting for non-linearities introduced by the sub-DACs in the first pipeline stages, which can create harmonic and intermodulation distortion in the digital output signal. Because non-linearities in the sub-DAC create errors that are only present in the residue output of each stage, the errors are difficult distinguish from alterations in the input signal of the stage. In some cases, sub-DAC nonlinearities may be addressed using calibration techniques that add complexity and power consumption.

SUMMARY

In accordance with an embodiment, a continuous-time delta-sigma analog-to-digital converter (ADC) includes: a continuous-time loop filter having an input coupled to an input of the continuous-time delta-sigma ADC; a multi-bit quantizer coupled to an output of the continuous-time loop filter; a 1-bit or 1.5 bit digital delta-sigma modulator having an input coupled to an output of the multi-bit quantizer and an output coupled to an input of the continuous-time loop filter; and a multi-bit digital delta-sigma modulator configured to requantize quantization error of the 1-bit or 1.5-bit digital delta-sigma modulator and having an output coupled to the input of the continuous-time loop filter and to an input of the 1-bit or 1.5-bit digital delta-sigma modulator.

In accordance with another embodiment, a method of operating a continuous-time delta-sigma analog-to-digital converter (ADC) includes: filtering an analog input signal using a continuous-time loop filter; quantizing an output of the continuous-time loop filter using a multi-bit quantizer to form a quantized signal; feeding back the quantized signal to an input of the continuous-time loop filter via a 1-bit or 1.5-bit digital delta-sigma modulator; subtracting a quantization error of the 1-bit or 1.5-bit digital delta-sigma modulator from the input of the continuous-time loop filter using a multi-bit digital delta-sigma modulator; and feeding back an output of the multi-bit digital delta-sigma modulator to an input of the 1-bit or 1.5-bit digital delta-sigma modulator.

In accordance with a further embodiment, a circuit includes: a delta-sigma modulator disposed on a monolithic semiconductor substrate. The delta-sigma modulator includes: an analog loop filter having an input coupled to an analog input node, a quantizer coupled to an output of the analog loop filter, and a sturdy multi-stage noise shaping digital-to-analog converter (DAC) coupled between an output of the quantizer and the input of the analog loop filter. The circuit also includes a functional circuit disposed on the monolithic semiconductor substrate and coupled to an output of the delta-sigma modulator.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
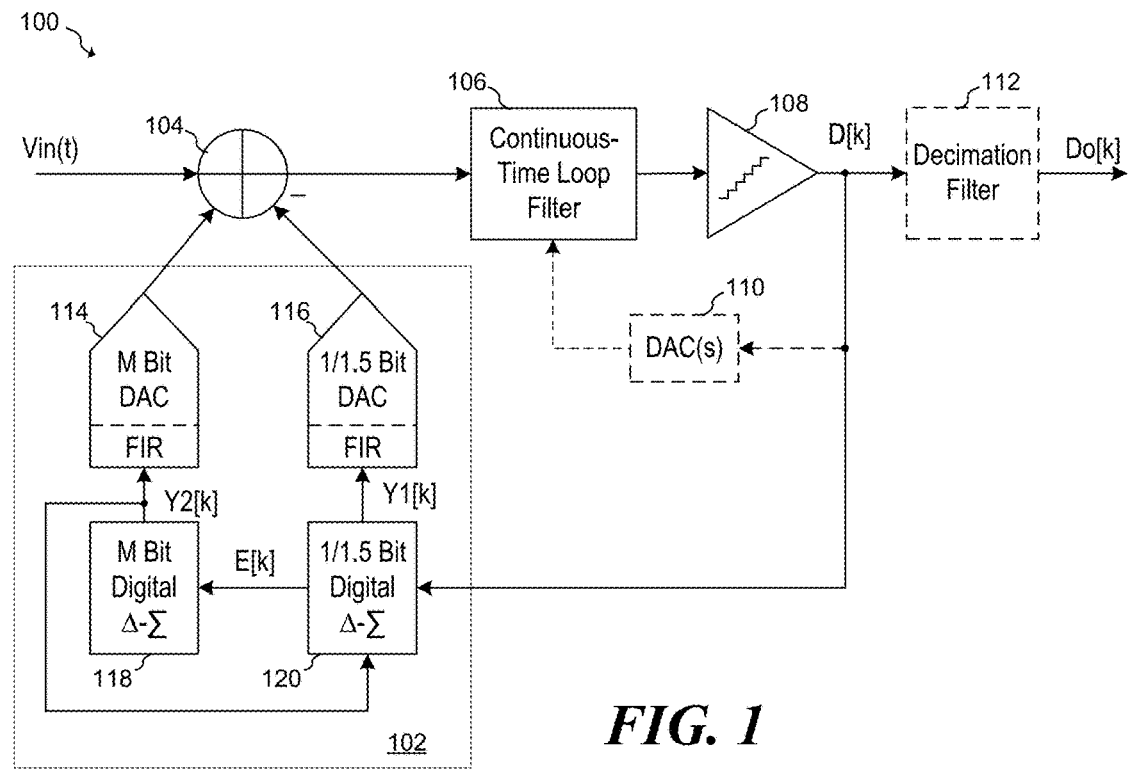
FIG. 1 illustrates a continuous-time delta-sigma ADC according to an embodiment.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In some embodiments of the present invention, a continuous-time delta-sigma converter includes a continuous-time loop filter in the forward path, a multi-bit quantizer and a sturdy multi-stage noise shaping (SMASH) digital-to-analog converter (DAC) in the feedback path. The SMASH DAC includes a 1 bit or a 1.5 bit digital DSM having a 1 bit or a 1.5 bit quantizer, and a multi-bit DSM that is configured to modulate the quantization noise generated by the 1 bit or 1.5 bit digital DSM such that the quantization noise can be later subtracted in the analog domain. In an embodiment, the output of the multi-bit DSM coupled to an input of the 1 bit or 1.5 bit digital DSM, which effectively allows for the subtraction of signal-dependent quantization noise from the input of the 1 bit or a 1.5 bit digital DSM and advantageously increases the maximum stable amplitude (MSA) of the 1 bit or 1.5 bit digital DSM. This increase in MSA advantageously allows for the use of higher order modulators for the 1 bit or 1.5 bit digital DSM.

Further benefits of using the SMASH structure in the feedback path of the continuous delta-sigma converter include increased jitter robustness and the fact that extra noise compensation filters are not necessary.

In some embodiments of the present invention, a pipelined ADC includes at least one stage in which the sub-DAC is implemented using a SMASH delta-sigma DAC. In some cases, the pipelined ADC may be a continuous-time pipelined ADC. Advantages of some embodiments include a high sub-DAC linearity due to the inherently linear DSM in the SMASH delta-sigma DAC. In some embodiments, the linearity of the sub-DAC is sufficiently high enough that additional linearization techniques are not necessary. Moreover, the increased MSA of the SMASH delta-sigma DAC allows for high linearity at high signal values.

In some embodiments, the architecture of the SMASH delta-sigma DAC can be significantly simplified. For example, when the bit width of the multi-bit quantizer of the multi-bit modulator of the SMASH delta-sigma DAC is the same as the bit width at the output of the sub-ADC, the structure portions of the digital loop filters of the delta-sigma DAC can be removed while high performance is maintained.

FIG. 1 illustrates continuous-time DSM 100 (also referred to as a continuous-time sigma-delta analog-to-digital converter) according to an embodiment of the present invention. Continuous-time DSM 100 includes a continuous-time loop filter 106, a multi-bit quantizer 108, and a feedback DAC 102. Summer 104 functionally represents a summing and subtraction function with respect to input voltage Vin (t) and the output of feedback DAC 102. In some embodiments, summer 103 may be implemented using summing circuits known in the art, or may be implemented as a part of a first stage of continuous-time loop filter 106. Summing circuits described herein may also be referred to as subtractors when the summing circuit is configured to subtract one value from another value.

As shown, an optional decimation filter 112 may be included to decrease the sampling rate and increase the bit width of modulator output signal D[k]. In some embodiments, one or more additional feedback DACs 110 may be included depending on the structure of DSM 100.

During operation, the outputs of feedback DAC 102 are subtracted/summed with input voltage Vin(t) using summer 104. The output of summer 104 is filtered using continuous-time loop filter 106, and the output of continuous-time loop filter 106 is quantized using multi-bit quantizer 108 to form oversampled digital output signal D[k]. In some embodiments, oversampled digital output signal D[k] may be decimated using decimation filter 112.

In various embodiments, continuous-time loop filter 106 is implemented using continuous-time loop filter circuits known in the art. For example, in one embodiment, continuous-time loop filter 106 may be a cascade of continuous-time integrators and may optionally include one or more additional feedforward and/or feedback paths. The continuous-time integrators and/or other elements of continuous-time loop filter 106 may be implemented using active filter circuits, such as operational amplifier-based integrators, transconductance-C (gmC) integrators, or other filter circuits known in the art. In some embodiments, a discrete-time loop filter (not shown) could be used in place of or in addition to continuous-time loop filter 106. In such embodiments, the loop filter could be implemented using discrete-time loop filter structures known in the art, such as switched-capacitor filters. In various embodiments, continuous-time loop filter 106 may be implemented using one of many different filter structures such as a cascade of integrators with distributed feedback (CIFB), a cascade of integrators with distributed feed forward (CIFF), a combination thereof, or other type of structure. One or more DACs 110 may be added to the structure, for example, to implement distributed feedback.

Multi-bit quantizer 108 may be implemented using, for example, a flash ADC or other multi-bit comparator structure. Decimation filter 112 may be implemented, for example, using decimation filter architectures known in the art. For example, decimation filter 112 may include a comb filter implemented using a cascade of accumulators followed by a cascade of difference circuits. An infinite impulse response (IIR) filter or a finite impulse response (FIR) filter may also be used to provide further filtering. Alternatively, other filter structures may be used.

As shown, feedback DAC 102 includes a 1-bit or 1.5-bit digital DSM 120 having an output coupled to an inherently linear 1 bit or 1.5 bit DAC 116, and a multi-bit digital DSM 118 having an output coupled to a multi-bit DAC 114. In some embodiments, additional finite impulse response (FIR) filters may be optionally applied to the input of DACs 114 and 116 either using separate FIR filters or by using FIR-DACs as will be explained below. As shown, the quantization error output E[k] of 1-bit or 1.5-bit digital DSM 120 is coupled to an input of multi-bit digital DSM 118 so that multi-bit digital DSM 118 can requantize quantization error output E[k], and output Y2[k] of multi-bit DSM 118 is coupled to an input of 1-bit or 1.5-bit digital DSM 120. This configuration will be referred to as a sturdy MASH (SMASH) DSM. In embodiments of the present invention, using the dual quantization properties of a digital sturdy MASH DSM in the feedback path of an analog DSM provides benefits from the advantages of both multibit and 1-bit or 1.5-bit quantization. It allows for a high SQNR and large MSA due to the multibit quantization of the multi-bit portion of the SMASH delta-sigma converter, while providing high linearity of an inherently linear DAC (e.g., having 1 or 1.5 bits). Advantageously, SMASH DSMs are less sensitive to noise leakage than conventional MASH DSMs and can be implemented without noise cancellation filters in some embodiments.

In an embodiment, the output Y[k] of multi-bit DSM 118 is fed back to an input of inherently linear DSM 120. This allows feedback DAC 102 to achieve higher order noise shaping without limiting the stability compared to 1-bit or 1.5-bit single-stage DSM. Compared to a MASH DSM having a single bit first stage modulator, the MSA in a SMASH DSM is not degraded even when 1-bit or 1.5-bit quantization is applied in the first stage. Thus, when a SMASH DSM is used as a feedback DAC in an analog continuous-time DSM 100, the recombination of the SMASH DSM stages' outputs (via summer 104) at the input of the main modulator results in a multilevel signal. Accordingly, the resulting DSM has lower dynamic requirements, is highly immune to jitter, and has relaxed linearity requirements.

Figure 2A:
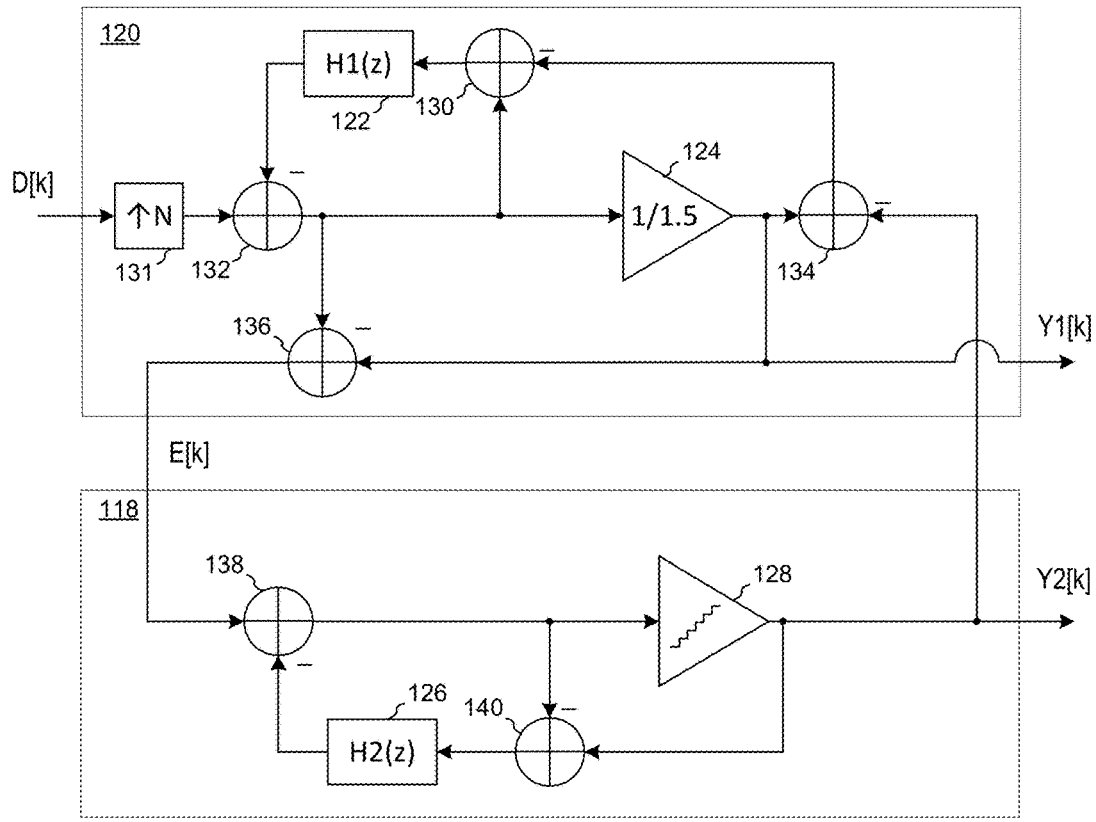
FIG. 2A illustrates a block diagram of one possible implementation of a 1-bit or 1.5-bit digital DSM and multi-bit digital DSM.

FIG. 2A illustrates a block diagram of one possible implementation of 1-bit or 1.5-bit digital DSM 120 and multi-bit digital DSM 118. As shown, inherently linear DSM includes upsampler 131, summers 130, 132, 134 and 136, a loop filter 122 and a quantizer 124. During operation upsampler 131 increases the sample rate of input signal D[k] by a factor of N. The output of loop filter 122 is subtracted from the upsampled signal via summer 132, the result of which is quantized by quantizer 124 to form output signal Y1[k]. The output of multi-bit digital DSM 118 is subtracted from the output of quantizer 124 via summer 134, and the output of summer 134 is subtracted from the output of summer 132 via summer 130. The output of summer 130 is filtered via loop filter 122. A signal E[k] representing the quantization error of 1-bit or 1.5-bit DSM 120 is formed by subtracting the quantized output of quantizer 124 from the input of quantizer 124 via summer 136.

Multi-bit digital DSM 118 includes summers 138 and 140, multi-bit quantizer 128 and loop filter 126. During operation, the output of loop filter 126 is subtracted from quantization error signal E[k] via summer 138, the output of which is quantized by multi-bit quantizer 128 to form output signal Y2[k]. The input of multi-bit quantizer 128 is subtracted from the output of multi-bit quantizer 128 via summer 140, the output of which is filtered by loop filter 126.

In one embodiment, loop filters 122 and 126 are each implemented using second order digital filters to yield a fourth-order digital DSM. The structure of these filters may be error feedback structure, for example. However, in alternative embodiments of the present invention other filter orders and/or filter structures may be used.

Upsampler 131 may be implemented using a digital circuit that increases the sampling rate such that samples of D[k] are repeated N times, each sample of D[k] is provided once and padded with zeros, or other upsampling scheme known in the art. In some embodiments, upsampler 131 may be advantageously omitted, for example, when the digital quantization noise from feedback DAC 102 is much smaller than the original quantization noise of the analog DSM.

Quantizers 124 and 128 may be implemented using digital comparators known in the art, and summers 130, 132, 134, 136, 138 and 140 may be implemented using digital summers known in the art, such as a digital adder or subtractor.

In some embodiments, 1-bit or 1.5-bit digital DSM 120 and multi-bit digital DSM 118 may be implemented using a DSP processor or a general-purpose processor in which case the various components in 1-bit or 1.5-bit digital DSM 120 and multi-bit digital DSM 118 are implemented by a combination of code stored in a non-transitory machine readable medium, such as memory and the processing hardware of the DSP processor or general-purpose processor. In some embodiments, these components may be implemented directly in hardware using digital logic circuits known in the art.

As mentioned above, in some embodiments an optional FIR filter may be coupled between the output of multi-bit digital DSM 118 and the input of multi-bit DAC 114, and between the output of 1-bit or 1.5-bit digital DSM 120 and the input of 1-bit or 1.5-bit DAC 116. This FIR filter may be implemented using a digital lowpass FIR filter to filter quantization noise from the outputs of M-bit digital DSM 118 and 1-bit or 1.5-bit digital DSM 120. This may reduce the large signal requirements of the first stage of continuous-time loop filter 106 and analog continuous-time DSM 100 by reducing signal swing at the input of the continuous-time loop filter 106 and may help avoid overloading multi-bit quantizer 108. The filtering of quantization noise may also reduce the jitter sensitivity of analog continuous-time DSM 100. In some embodiments, a compensating/reconstruction FIR filter may be needed in an inner feedback path the of analog continuous-time DSM 100 depending on the total delay of the FIR filter (e.g. greater than one clock period.)

Figure 2B:
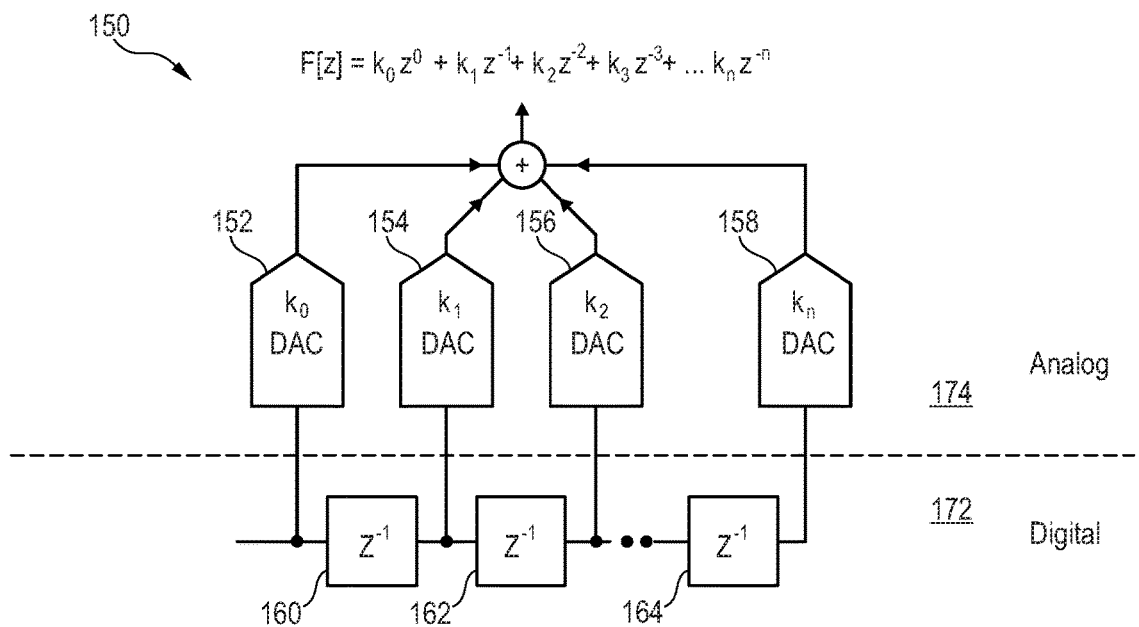
FIG. 2B illustrates an embodiment FIR-DAC circuit.

In some embodiments, DACs 114 and 116 and their associated FIR filter may be implemented using a mixed signal FIR-DAC structure such as the FIR-DAC 150 shown in FIG. 2B. As shown, FIR-DAC 150 includes both a digital portion 172 and an analog portion 174. The digital portion 172 includes unit delay blocks 160, 162 and 164 that may be implemented, for example, using clocked registers. Analog portion 174 includes DACs 152, 154, 156 and 158 having corresponding weights $k_0, k_1, k_2 \ldots k_n$. In embodiments, FIR-DAC 150 may utilize any number of delay blocks or DACs depending on the required transfer function. In the depicted embodiment, filter structure 150 has a transfer function of:

$$F[z] = k_0 z^0 + k_1 z^{-1} + k_2 z^{-2} + k_3 z^{-3} + k_n z^{-n}.$$

Using FIR-DAC 150 is advantageous in that a high level of linearity can be achieved during operation of DSM 100. For example, DACs 152, 154, 156 and 158 may be implemented using 1-bit or 1.5-bit DACs, which are inherently linear. In embodiments, the filter length n is based on the amount if filtering needed to filter quantization noise, which depends on the particular embodiment and its specifications. However, it should be noted that in some embodiments, the FIR filter may be omitted because the multi-bit nature of the output of feedback DAC 102 reduces the signal swing seen at the input of continuous-time loop filter 106 and provides jitter robustness.

DACs 152, 154, 156 and 158, or DACs 114 and 116 may be implemented using DAC circuits known in the art, including, but not limited to current DACs using switch current sources, resistor ladder DACs, and switched capacitor DACs. In some embodiments, DACs 114 and 116 may employ identical unit cells (e.g. unit current sources, resistors, and the like) in order to reduce gain mismatch between the DACs.

Figure 3A:
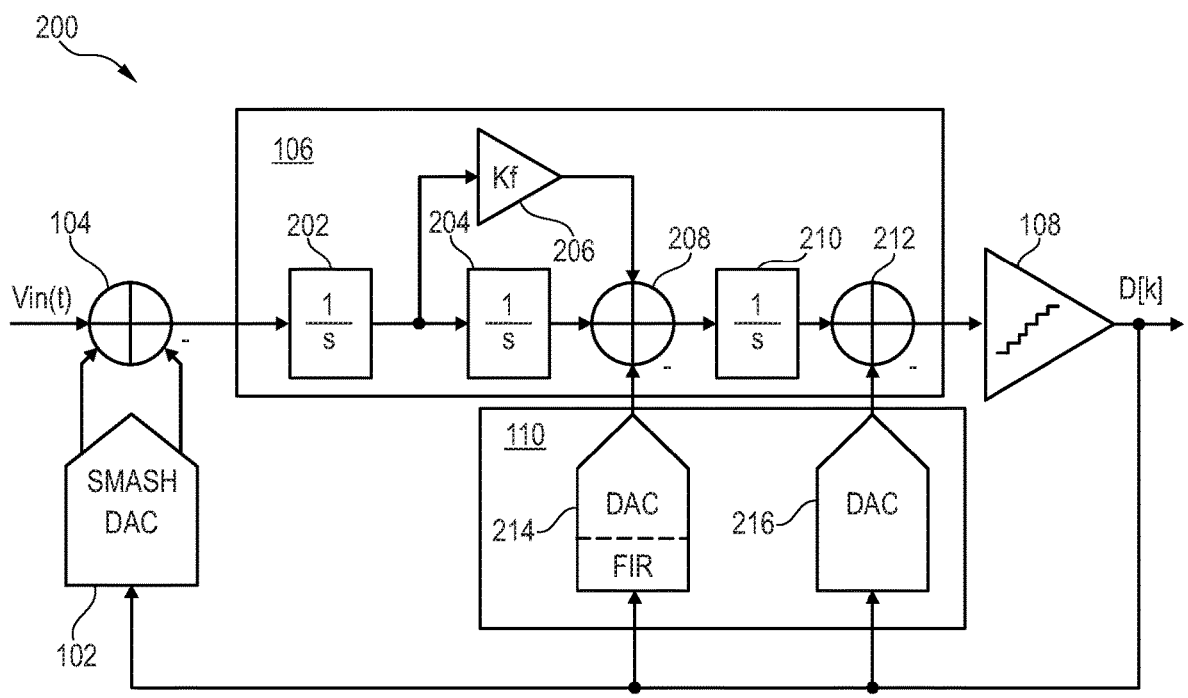
FIG. 3A illustrates a third-order analog continuous-time DSM circuit according to an embodiment.

FIG. 3A illustrates a third-order analog continuous-time DSM circuit 200 that could be used to implement continuous-time DSM 100 shown in FIG. 1. As shown, the continuous-time loop filter 106 of analog continuous-time DSM circuit 200 is a third order loop filter that includes three integrators 202, 204 and 210, amplifier 206 and two summers 208 and 212. Inner loop DACs 110 includes DACs 214 and 216.

In continuous-time loop filter 106, integrators 101, 204 and 210 are coupled in series, while amplifier 206 having a gain of Kf is coupled in parallel with integrator 204. Inner feedback from DAC 214 is subtracted from the output of integrator 204 via summer 208, and inner feedback from DAC 216 is subtracted from the output of integrator 210 via summer 212. DACs 214 and 216 may be multi-bit DACs having a same resolution as multi-bit quantizer 108 in some embodiments. Alternatively, DACS 214 and 216 may have a greater or lower resolution. For example, in an embodiment in which SMASH DAC 102 implements FIR filtering prior to DACs 114 and 116, the input of DAC 214 may be filtered using a FIR compensation filter. Some embodiments the combination of the FIR filter and DAC 214 may be implemented using a mixed-signal FIR-DAC as described above with respect to FIG. 2B. However, in other embodiments, the FIR filters in SMASH DAC 102 and the FIR filter associated with DAC 214 may be omitted.

It should be understood that the implementation of third-order analog continuous-time DSM circuit 200 shown in FIG. 3A is just one of many possible implementations of embodiment analog-continuous-time DSM circuits. In alternative embodiments, the order and structure of continuous-time loop filter 106 and the number of DACs in inner feedback DACs (if any) may be different.

Figure 3B:
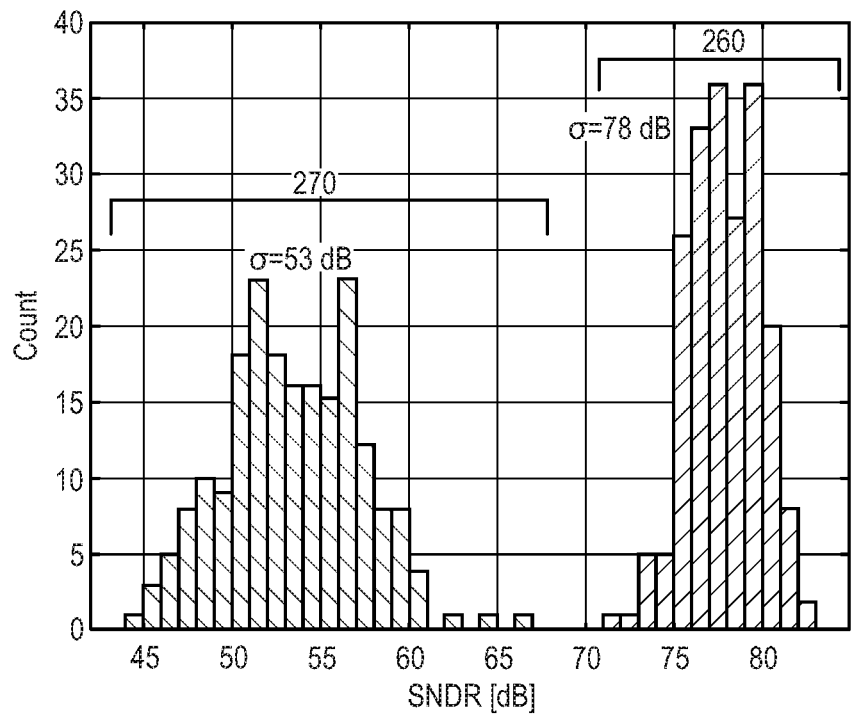
FIG. 3B illustrates a histogram comparing the performance of the continuous-time DSM of FIG. 3A with a conventional continuous-time DSM.

FIG. 3B illustrates a histogram showing the simulated signal-to-noise-and-distortion ratios for the embodiment of FIG. 3A (group 260) and a conventional continuous-time DSM (group 270). In this simulation, both the embodiment and conventional DSMs are configured as third order DSMs with an oversampling ratio of 14 and 1% mismatch in their DAC unit elements. As shown, the conventional DSM has a mean SNDR of 53 dB, while the embodiment DSM has a mean SNDR of 78 dB, which is a significant improvement.

In some embodiments, some or all of the components of the data converters disclosed herein may be disposed on a single monolithic semiconductor integrated circuit, such as a single monolithic semiconductor substrate, and/or on the same monolithic semiconductor integrated circuit as other disclosed system components. The semiconductor substrate may be a silicon substrate, and may be fabricated using one of a variety of different semiconductor processes, such as a CMOS process, a BiCMOS process, a Bipolar process, or other type of semiconductor process.

Figure 4:
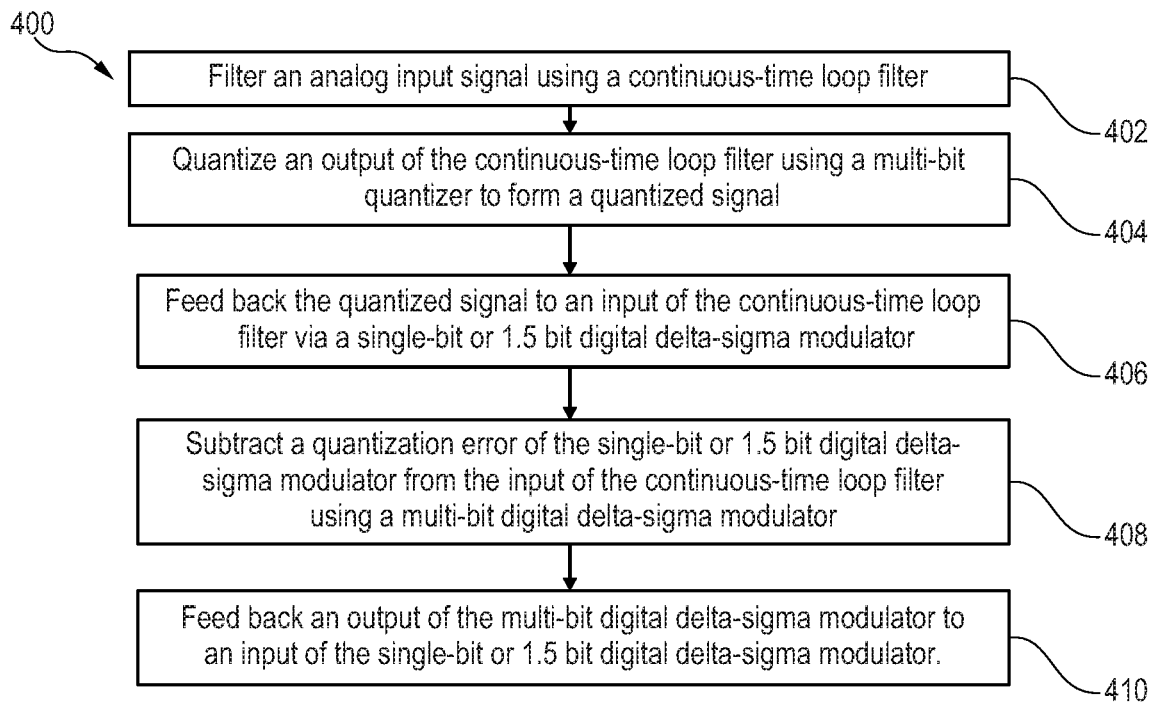
FIG. 4 illustrates a flowchart of a method of operating a continuous-time delta-sigma ADC according to an embodiment.

FIG. 4 illustrates a flowchart of a method 400 of operating a continuous-time delta-sigma converter. In step 402, an analog input signal is filtered using a continuous-time loop filter, such as continuous-time loop filter 106 described above with respect to FIGS. 1 and 3. In step 404, the output of the continuous-time loop filter is quantized using a multi-bit quantizer, such as multi-bit quantizer 108 to form a quantized signal. The quantized signal is fed back to an input of the continuous-time loop filter via a 1-bit or 1.5-bit digital delta-sigma modulator in step 406. This 1-bit or 1.5-bit digital delta-sigma modulator could be implemented using 1-bit or 1.5-bit digital DSM 120 discussed above with respect to FIGS. 1 and 2A, as well as a DAC, such as 1-bit or 1.5 bit DAC 116 described above.

Step 408 includes subtracting a quantization error of the 1-bit or 1.5-bit digital delta-sigma modulator from the input of the continuous-time loop filter using a multi-bit digital delta-sigma modulator. This multi-bit digital delta-sigma modulator could be implemented using multi-bit digital DSM 118 discussed above with respect to converting quantization error signal E[k] to output Y2[k] that is a multi-bit digital representation of quantization error signal E[k]. In some embodiments, converting output Y2[k] to an analog signal using a DAC and providing the analog signal to the input of the continuous-time loop filter effectively subtracts the quantization noise of the 1-bit or 1.5-bit digital delta-sigma modulator from the input of the continuous-time loop filter. In step 410 an output of the multi-bit digital delta-sigma modulator is fed back to an input of the 1-bit or 1.5-bit digital delta-sigma modulator. In some embodiments, output Y2[k] of multi-bit digital DSM is provided to an input of 1-bit or 1.5-bit digital DSM 120.

Figure 5A:
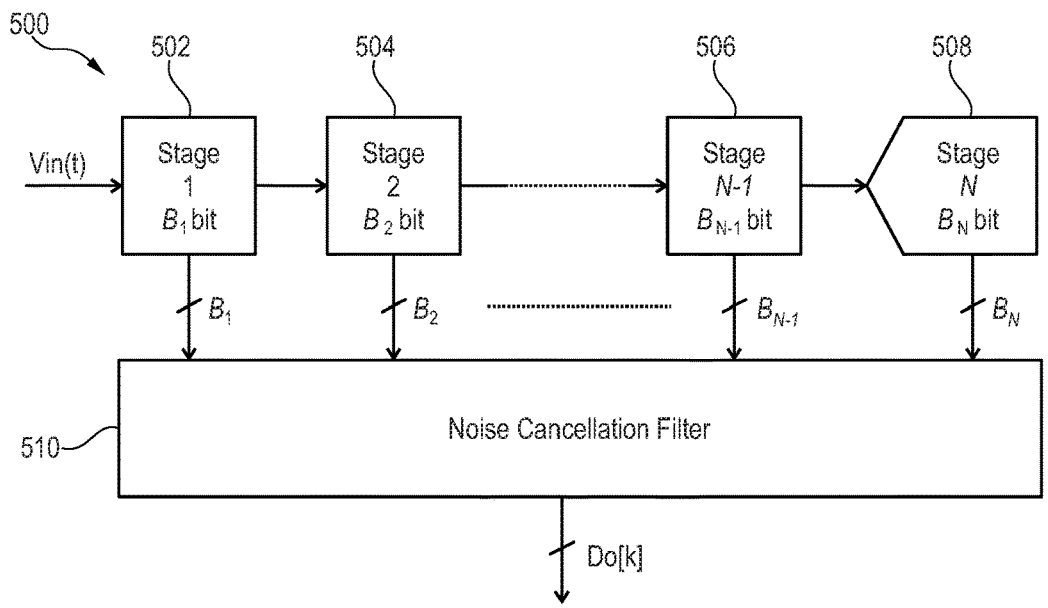
FIG. 5A illustrates a block diagram of a continuous-time pipelined ADC.

FIG. 5A illustrates a continuous-time pipelined ADC 500 according to an embodiment of the present invention that is configured to convert analog input signal Vin(t) to digital output Do[k]. As shown, pipelined ADC 500 is composed of N pipeline stages, specifically, N−1 stages 502 504 506 that include a sub-ADC, sub-DAC, (optional) filter and inter-stage filter and an Nth stage 508 that includes an ADC. Each of these stages contributes a specific number of bits to the overall digital output. The digital outputs for each stage, 502, 504, 506 and 508, are then fed to a noise cancellation filter 510 (also referred to as an output decoder), which processes these outputs and provides the final, $B_{tot}$ bit output word Do[k], where $B_{tot}$ is the total number of output bits.

Each pipelined stage 502, 504, 506, and 508 includes a sub-ADC that is configured to quantize its analog input signal into a specific number of bits, and forms a residue by converting the output of the sub-DAC into an analog value, subtracting the analog value from the stages analog input signal, and forward the residue to the next stage. For example, analog input signal Vin(t) enters the first pipeline stage 502, which quantizes the input signal into B1 bits, forms a residue representing the difference between the analog input signal and the digitized B1 representation, and forwards the residue to the input of pipeline stage 504. Pipeline stage 504 digitizes the residue produced by pipeline stage 502 into B2 bits and produces a new residue based on the output of pipeline stage 502 and the digitized B2 bit residue. Each successive stage operates on the residue of its preceding stage in a similar manner until the sample reaches last stage 508, which simply digitizes the residue produced by next-to-last stage 506.

Noise cancellation filter 510 aggregates the digital outputs of each pipeline stage 502, 504, 506 and 508 to form output word Do[k]. Noise cancellation filter 510 (also referred to as a digital reconstruction filter) may be implemented using noise cancellation filter and digital reconstruction filter systems and methods known in in the art. One example of this is the reconstruction filter disclosed in H. Shibata et al., "A 9-GS/s 1.125-GHz BW Oversampling Continuous-Time Pipeline ADC Achieving −164-dBFS/Hz NSD," in *IEEE Journal of Solid-State Circuits*, vol. 52, no. 12, pp. 3219-3234 December 2017. The noise cancellation filter 510 can be implemented using various digital filter techniques, such as finite impulse response (FIR) filters or infinite impulse response (IIR) filters. These filters are designed to reject noise and errors introduced in the ADC pipeline stages while preserving the integrity of the original signal. The choice of filter type and its specific parameters may depend on the desired performance characteristics, such as the amount of noise reduction, passband flatness, phase response, and computational complexity.

In some embodiments, the pipelined ADC 500 may be configured to correct for additional errors such as gain errors, offset errors or added non-linearity introduced by the sub-ADC of each stage. This can be accomplished, for example by providing additional and redundant input range for one or more sub-ADCs as known in the art. Thus, errors made in the quantizing the input signal of a particular stage will be reflected in its generated residue. By providing additional input range, the sub-ADC of the next stage is able to digitize out-of-range residues to recover from errors made in previous stages. This well-known error correction mechanism, however, is unable to correct for errors and non-linearities in the sub-DAC, as errors caused by the sub-DAC are indistinguishable from alterations in the input signal for the converter. Such non-linearities may lead to harmonic distortion, increased integral and differential non-linearity, and reduced SNDR of the converter. Thus, in embodiments of the present invention, the sub-DAC of one or more stages of embodiment pipelined ADC 500 are made more linear by implementing the sub-DAC as a SMASH DSM.

Figure 5B:
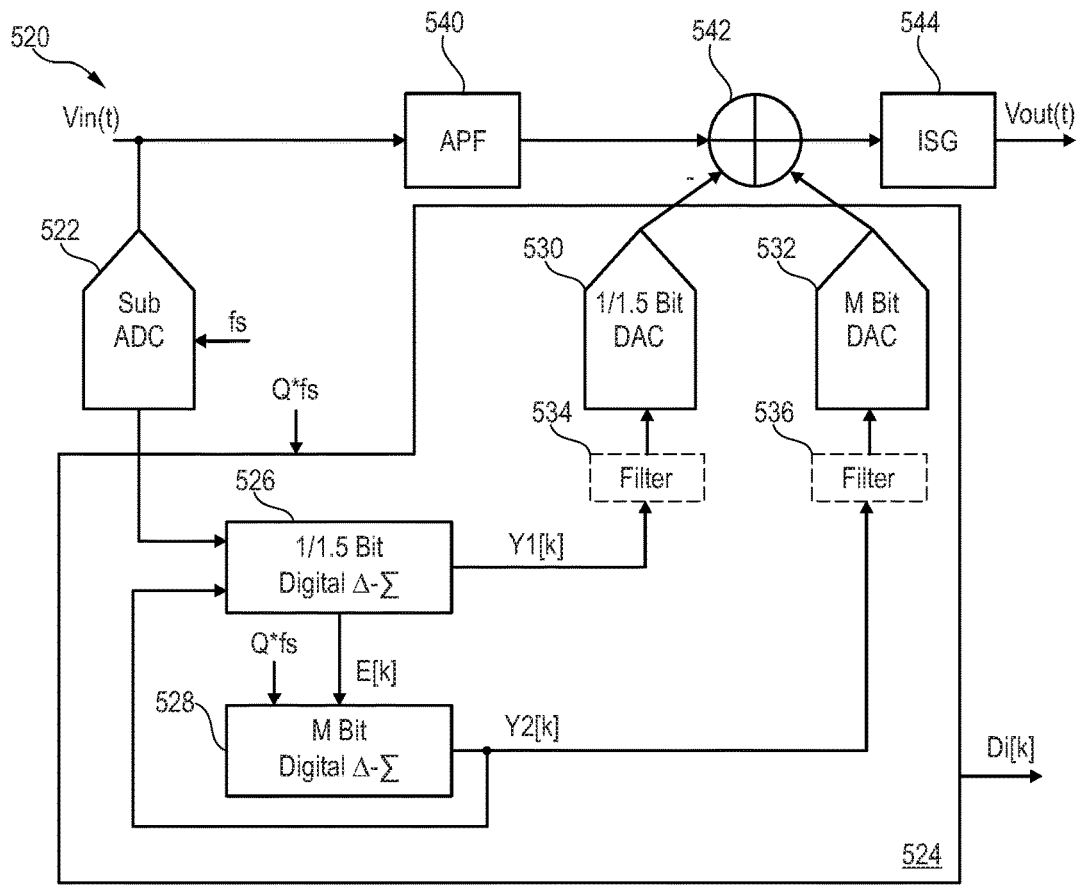
FIG. 5B illustrates a block diagram of a pipeline stage of the continuous-time pipelined ADC of FIG. 5A according to an embodiment.

FIG. 5B illustrates a block diagram of a pipeline stage 520 according to an embodiment that could be used to implement one or more pipeline stages 502, 504, 506 and 508 shown in FIG. 5A. As shown, pipeline stage 520 includes sub-ADC 522 having an input coupled to the input of the pipeline stage and having an output coupled to sub-DAC 524. Optional filter 540 may be used to match the propagation delay of sub-ADC 522 and sub-DAC 524. In some embodiments, filter 540 may be implemented using an analog continuous-time allpass filter, however, other filter and/or delay structures capable of equalizing the delay and magnitude between the main signal path and sub-ADC 522 and sub-DAC 524 may be used. The output of sub-DAC 524 is subtracted from a delayed version of analog input signal Vin (t) via summer 542, and then amplified by inter-stage gain circuit 544 to form residue output voltage Vout(t). It should be understood that while the illustrated example shows the input and output signals being voltages Vin(t) and Vout(t), these output signals could be currents in alternative embodiments. In some embodiments inter-stage gain circuit 544 and summer 542 may be implemented using respective amplifiers, or may be implemented using a single amplifier with multiple inputs to incorporate the functions of both inter-stage gain circuit 544 and summer 542. Amplifier circuits known in the art, such as operational amplifiers with resistive feedback, transconductance amplifiers, and other types of amplifiers could be used. Filter 540 may be implemented using an active or passive filter, such as a passive RC filter, an active RC filter or other type of suitable filter circuit known in the art.

Sub-DAC 524 includes a 1-bit or 1.5-bit digital DSM having an input coupled to the output of sub-ADC 522 and an output Y1[k] coupled to a 1 bit or 1.5 bit DAC 530. The quantization error output E[k] of 1-bit or 1.5-bit digital DSM 526 is coupled to an input of multi-bit digital DSM 528, and the output Y2[k] of multi-bit digital DSM 528 is coupled to an input of 1-bit or 1.5-bit digital DSM 526 to form a digital SMASH DSM. Output Y2[k] of multi-bit digital DSM 528 is also coupled to the input of multi-bit DAC 532. In some embodiments, digital filter 534 is coupled between the output of 1-bit or 1.5-bit DSM 526 and inherently linear 1-bit or 1.5-bit DAC 530, and digital filter 536 is coupled between the output of multi-bit digital DSM 528 and the input of multi-bit DAC 532 as discussed in further detail below. In some embodiments, filter 534 and 1-bit or 1.5 bit DAC 530 may be combined, and filter 536 and multi-bit DAC 532 may be combined using mixed signal FIR-DACs as described above with respect to FIG. 2B.

Figure 6A:
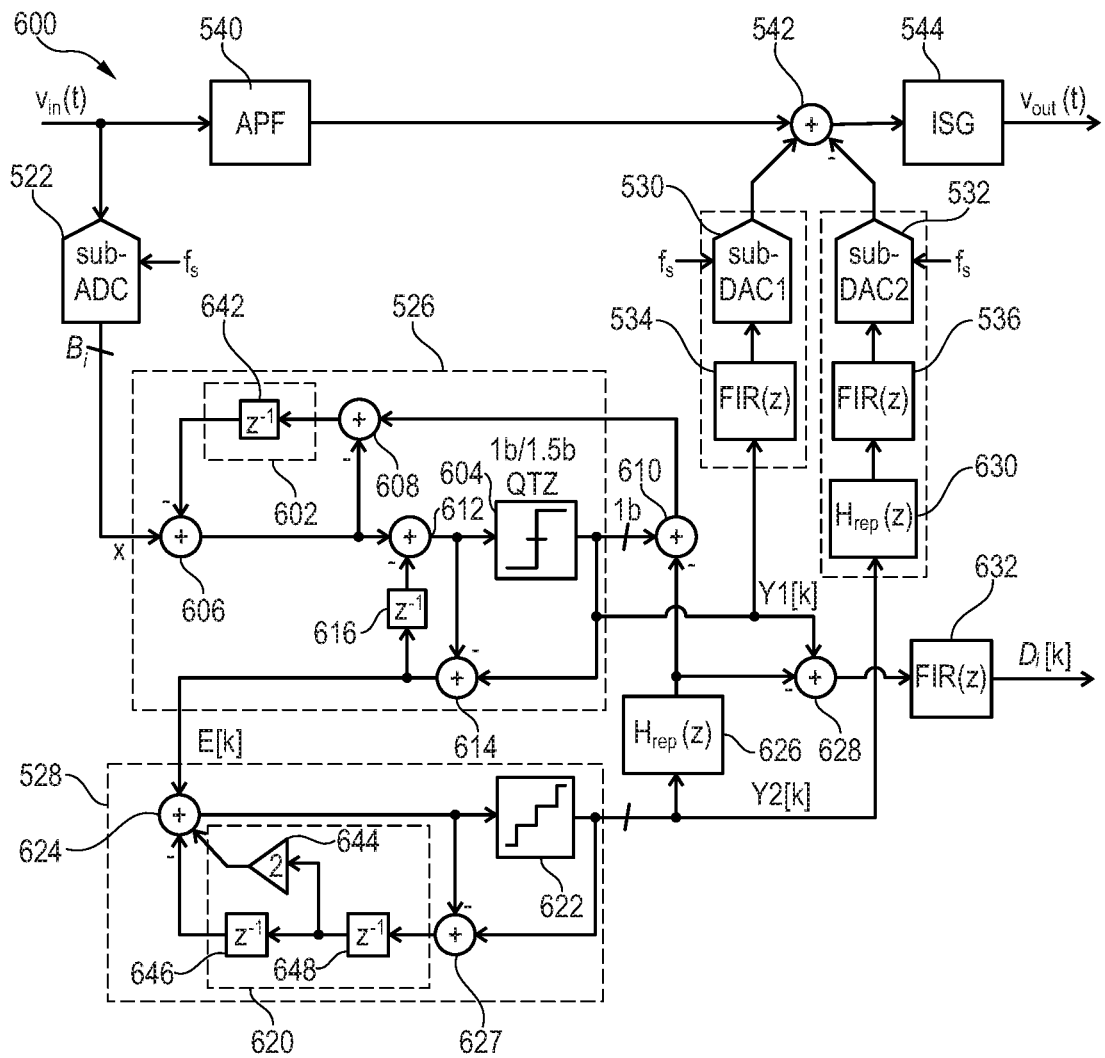
FIG. 6A illustrates a block diagram of an embodiment pipeline stage.

FIG. 6A presents a block diagram depicting one potential implementation of an embodiment of pipeline stage 600, which may be utilized for pipeline stage 520 as displayed in FIG. 5B. This diagram demonstrates various implementation aspects of 1-bit or 1.5-bit digital DSM 526 and multi-bit digital DSM 528, along with the inclusion of additional digital filters 626, 630, and 632.

As shown, 1-bit or 1.5-bit digital DSM 526 includes summers 606, 608, 612, and 614, a loop filter 602 and a quantizer 604, which may be a one-bit (e.g., two-level) quantizer or a 1.5 bit (e.g., three-level) quantizer. During operation, the output of loop filter 602 is subtracted from the output of sub-ADC 522 via summer 606, the result of which is summed with the output of delay circuit 616 via summer 612. The output of summer 612 is quantized by quantizer 604 to form output signal Y1[k]. The output of multi-bit digital DSM 528 is subtracted from the output of quantizer 604 via summer 610, and the output of summer 606 is subtracted from the output of summer 610 via summer 608. The output of summer 608 is filtered via loop filter 602. A signal E[k] representing the quantization error of 1-bit or 1.5-bit digital DSM 526 is formed by subtracting the quantized output of quantizer 604 from the input of quantizer 604 via summer 614.

Delay circuit 616 injects a delayed version of quantization error signal E[k] into the input of quantizer 604, which effectively provides deterministic dithering (also known as noise coupling) to 1-bit or 1.5-bit digital DSM 526. As such, delay circuit 616 may also be referred to as a deterministic dithering circuit. This deterministic dithering helps decorrelate quantization error signal E[k] from the input signal and helps remove/reduce large signal related components that might still be present in the quantization error signal. Removing or reducing these large signal related components reduces the amount of signal related components that would be processed by multi-bit digital DSM 528, thereby reducing the amplitude of signal related components that would be reflected in the residue of pipeline stage 600 via multi-bit DAC 532 (that might be non-linear due to its multi-bit nature). Thus, the net result of the deterministic dithering is increased SNDR. In some embodiments, deterministic dithering may be replaced by more traditional random or pseudorandom dithering by removing delay circuit 616 and applying an output of a random or pseudorandom signal generator (such as a linear feedback shift register) to the input of quantizer 604.

Because delay circuit 616 introduces additional first order noise shaping, additional filters 626 and 630 respectively coupled between the output of multi-bit digital DSM 528 and the inputs of 1-bit or 1.5-bit digital DSM 526 and multi-bit DAC 532 may be used to compensate for the effect of delay circuit 616. The transfer function of filters 626 and 630 may be $1-z^{-1}$. In some embodiments, filters 626 and 630 may be replaced by a single filter having its output coupled to both the input of 1-bit or 1.5-bit digital DSM 526 and multi-bit DAC 532.

Multi-bit digital DSM 528 includes summers 624 and 627, multi-bit quantizer 622 and loop filter 620. During operation, the output of loop filter 620 is subtracted from quantization error signal E[k] via summer 624, the output of which is quantized by multi-bit quantizer 622 to form output signal Y2[k]. The input of multi-bit quantizer 622 is subtracted from the output of multi-quantizer 622 via summer 627, the output of which is filtered by loop filter 620.

Loop filters 602 and 620 can be implemented in a variety of different ways. In the examples shown in FIG. 6A, loop filter 602 of 1-bit or 1.5-bit digital DSM 526 is a first order digital filter that includes a delay circuit 642, and loop filter 620 of multi-bit digital DSM 528 includes a second order filter including delay circuit 646 and 648 and digital gain stage 644. In some embodiments digital gain stage may have a gain of two. In such embodiments, the gain may be achieved by applying a left-shift to the input of digital gain stage 644. Delay circuits 616, 642, 646 and 648 may be implemented, for example, using registers.

It should be appreciated that the illustrated implementation of loop filters 620 and 640 is just one example of many possible filter implementations that could be used for embodiment pipeline stages. In alternative embodiments, loop filters 620 and 602 may have different orders and/or different filter architectures depending on the particular embodiment and its specifications. For example, other digital filter architectures known in the art may be used.

In some embodiments, noise cancellation filter 510 (FIG. 5A) is coupled to a digital output of the SMASH sub-DAC 524 instead of sub-ADC 522 in order to reduce the effect of quantization noise on the final digital output. In the illustrated embodiment, digital output signal Di[k] of pipeline stage 600 is formed by subtracting output Y2[k] of multi-bit digital DSM 528 (or the filtered output of multi-bit digital DSM 528) from output Y1[k] of 1-bit or 1.5-bit digital DSM 526 via summer 628.

In some embodiments, filters 534 and 536 respectively coupled to the inputs of inherently linear 1-bit or 1.5-bit sub-DAC 530 and multi-bit DAC 532 may be included to filter out-of-band quantization noise, harmonic and/or intermodulation distortion prior to signals Y1[k] and Y2[k] being converted to the analog domain. A corresponding FIR filter 632 may also be coupled to the output of summer 628 to filter the out-of-band quantization noise, harmonic and/or intermodulation distortion prior to being processed by noise cancellation filter 510. FIR filters 534, 536 and 632 may be implemented using lowpass FIR filter structures known in the art.

In some embodiments, DACs 530 and 532 and their respective pre-filters 534, 536 and 630 can be combined together as a mixed signal FIR-DAC according to the principles described above with respect to FIG. 2B. Moreover, the structure of the FIR-DAC used to implement multi-bit DAC 532 and pre-filters 536 and 630 can be further simplified as explained below.

Figure 6B:
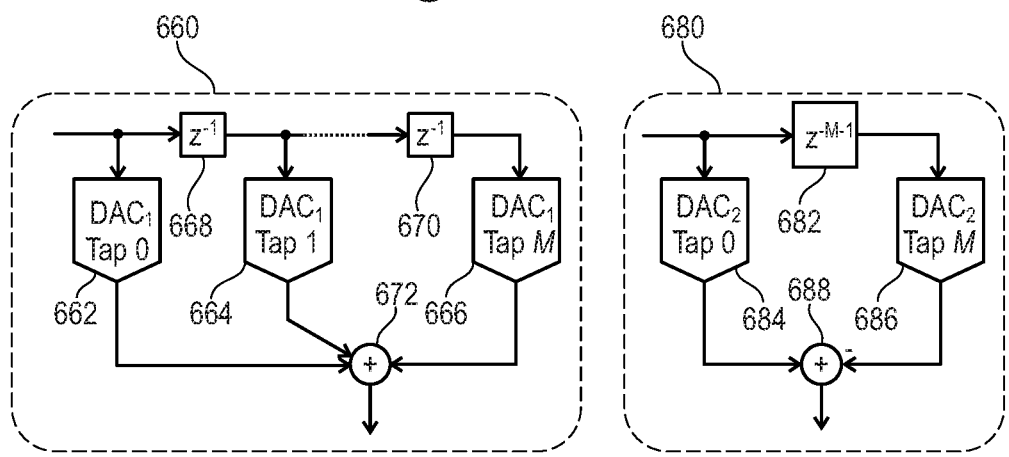
FIG. 6B illustrates block diagrams of digital FIR-DACs according to an embodiment.

FIG. 6B illustrates block diagrams of FIR-DAC 660 that can be used to implement the combination of 1-bit or 1.5 bit DAC 530 and digital filter 534, and FIR-DAC 680 that can be used to implement the combination of multi-bit DAC 532 and digital filters 536 and 630. As shown, FIR-DAC 660 includes M delay circuits 668 and 670 with a transfer function of $z^{-1}$, M+1 DACs 662, 664 and 666 and summer 672. While only three DACs and two delay circuits are shown for simplicity of illustration, it should be understood that the number of DACs and delay circuits are M+1 and M, respectively. In some embodiments, FIR-DAC 660 implements a transfer function of $\Sigma_{i=0}^{M} z^{-i}/(M+1)$.

FIR-DAC 680 includes only one delay circuit 682 with a transfer function of $z^{-M-1}$, two DACs 684 and 686, and summer 688. This simplified structure is achievable when the transfer function of filter 536 is $\Sigma_{i=0}^{M} z^{-i}/(M+1)$ and the transfer function of filter 630 is $(1-z^{-1})$. Multiplying these two transfer functions yields the simple to implement transfer function of $(1-z^{-M-1})/(M+1)$.

Figure 7A:
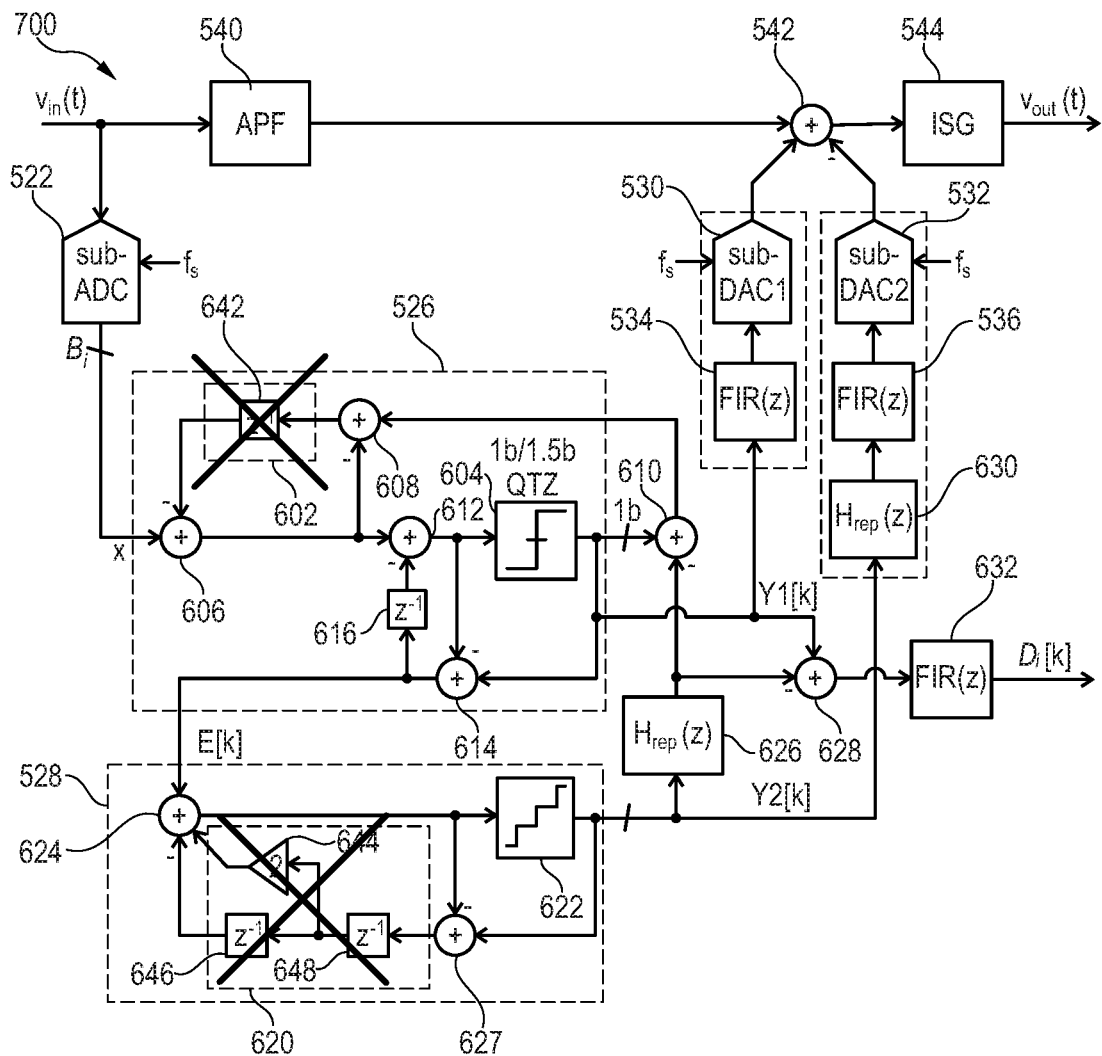
FIGS. 7A, 7B, 7C and 7D illustrate block diagrams of pipeline stages according to embodiments.

In some embodiments, the structure of SMASH sub-DAC 524 can be further simplified by removing the loop filters 602 and 620 from 1-bit or 1.5-bit digital DSM 526 and multi-bit digital DSM 528. The resulting structure of this modification is illustrated in FIG. 7A, which illustrates pipeline stage 700. This essentially simplifies the system such that 1-bit or 1.5-bit digital DSM 526 and multi-bit digital DSM 528 are zeroth order modulators for implementations that do not implement delay circuit 616 for deterministic dithering. For implementations that implement delay circuit 616, 1-bit or 1.5-bit digital DSM 526 functions as a first-order modulator.

Figure 7B:
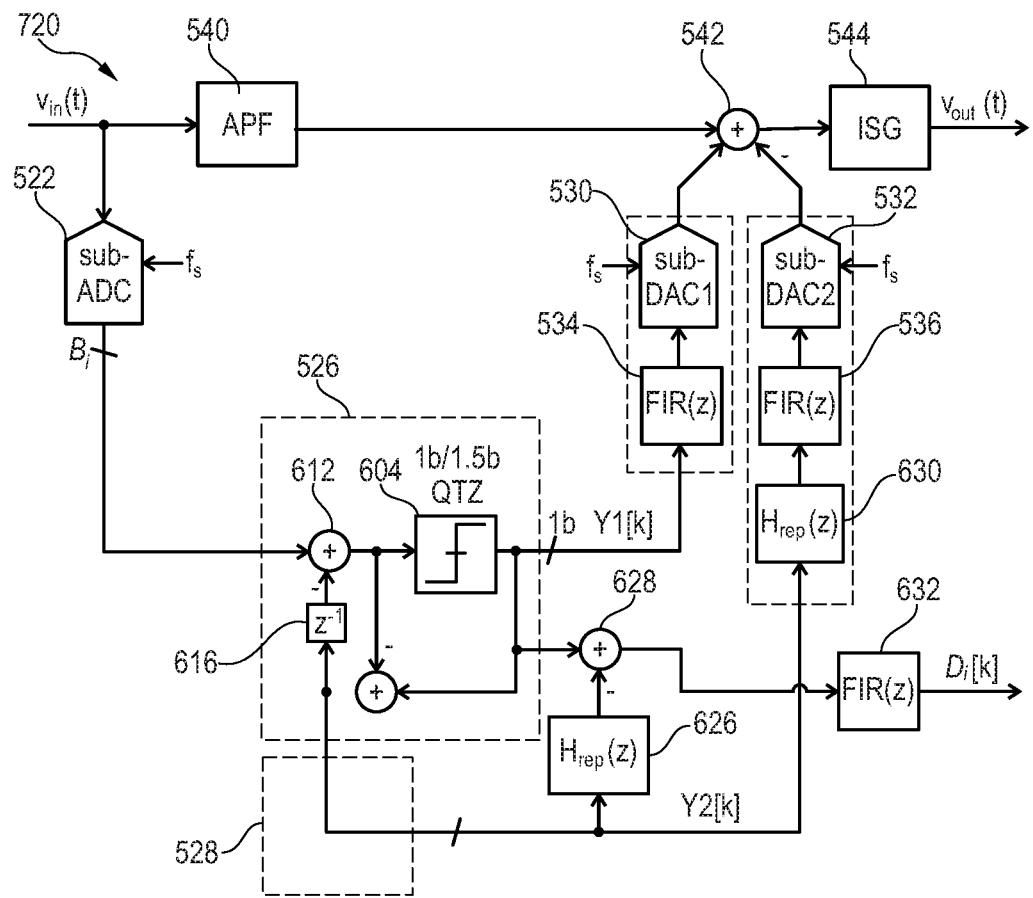

By selecting the bit-width of multi-bit quantizer 622 to match the bit resolution of sub-ADC 522, pipeline stage 700 of FIG. 7A can be further simplified as shown with respect to pipeline stage 720 shown in FIG. 7B. When this condition is met, it can be shown that structure of pipeline stage 720 is mathematically equivalent to pipeline stage 700 as long as the structure is not overloaded. When the bit-width of multi-bit quantizer 622 matches the bit resolution of sub-ADC 522, the quantization error of multi-bit digital DSM 528 is zero so that the input and output of loop filter 620 of multi-bit digital DSM 528 is zero. Thus, 1-bit or 1.5-bit digital DSM 526 is simplified to only include summer 612, delay circuit 616 and 1 bit or 1.5 bit quantizer 605, and multi-bit digital DSM 528 can be modified by removing all of its components so that quantization error signal E[k] effectively functions as output Y2[k] of multi-bit digital DSM 528. In addition to the advantageous simplification of circuit complexity, pipeline stage 720 benefits from the fact that no additional quantization noise is added in the digital domain, which relaxes constraints on filtering properties of succeeding pipeline stages.

In some embodiments, an additional slow dither circuit (not shown) may be added to the input of 1 bit or 1.5 bit quantizer 604 in order to reduce idle tones that may be generated due to the fact that the 1-bit or 1.5-bit digital DSM functions as a first-order loop. This dither can be removed using an auxiliary DAC (not shown) coupled in parallel with DACs 530 and 532, or may be removed using other dither removal methods, such as digital dither removal methods known in the art.

Figure 7C:
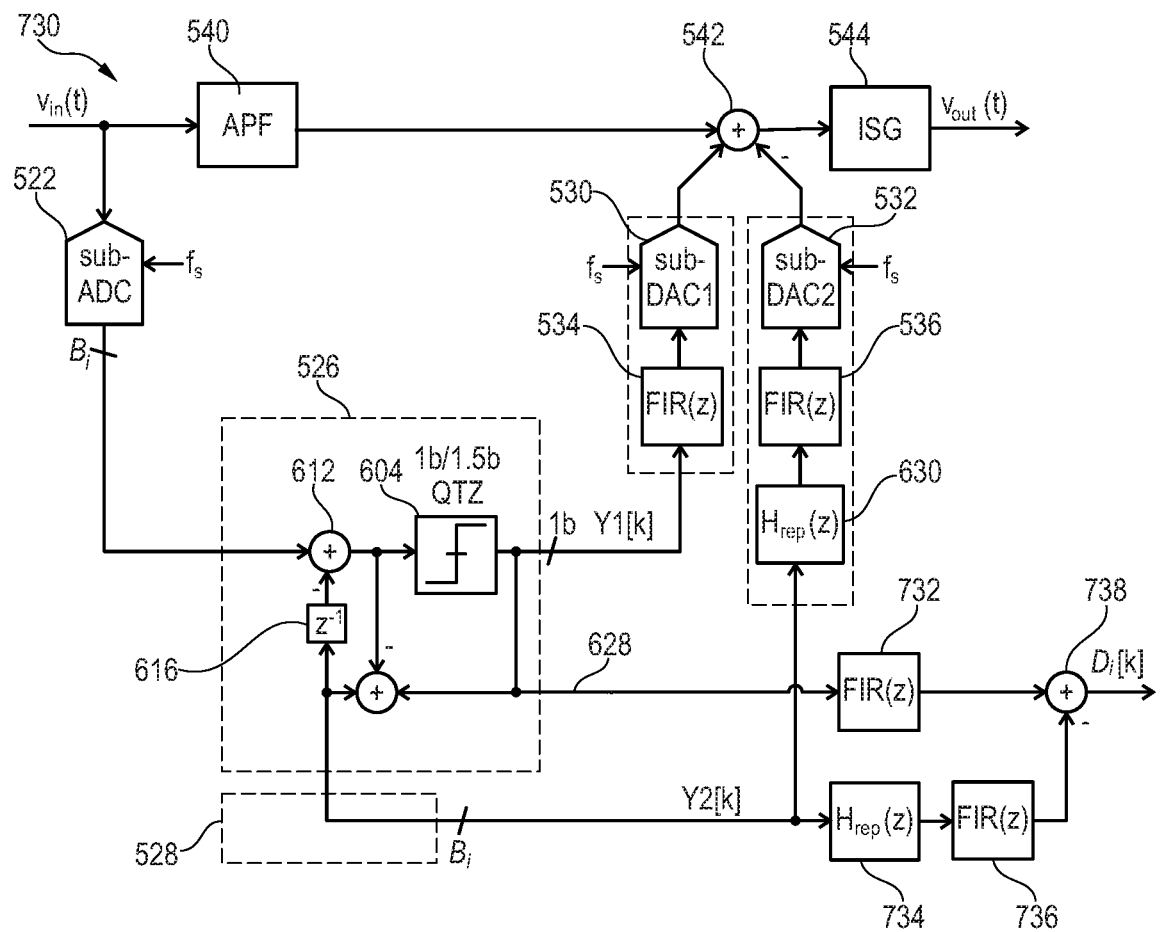

In an alternative embodiment, pipeline stage 730 shown in FIG. 7C is similar to pipeline stage 720 shown in FIG. 7B with the exception that digital output word $D_i[k]$ is formed using FIR filter 732 coupled to output Y1[k] of 1-bit or 1.5-bit digital DSM 526, compensation filter 734 and FIR filter 736 coupled to signal Y2[k] and summer 738.

Figure 7D:
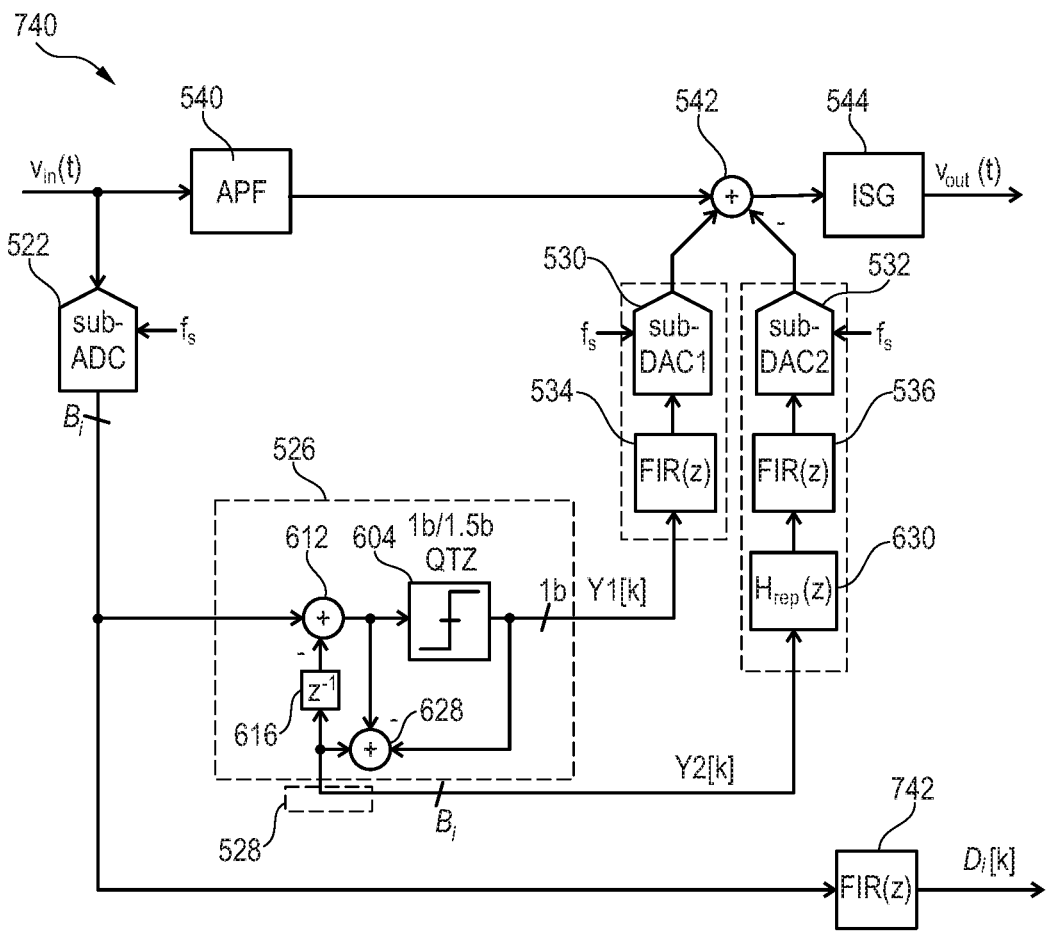

In a further alternative embodiment, pipeline stage 740 shown in FIG. 7D is similar to pipeline stage 720 shown in FIG. 7B with the exception that digital output word $D_i[k]$ is formed using FIR filter 742 coupled to the output of sub-ADC 522.

The simulated performance of pipeline stage 720 in FIG. 7B, configured with a sub-ADC 522 having a six-bit resolution, an oversampling ratio of 10, and DAC elements exhibiting a 0.5% standard deviation in mismatch, yields a mean in-band noise and distortion (IBN+D) of approximately −84 dBFS. This performance is comparable to a traditional pipeline stage that utilizes a sub-DAC with a conventional thermometer-coded DAC and data weighted averaging (DWA). However, the thermometer weighted DAC with DWA is larger and more complex than the embodiment DACs, due to the required switching matrices for DWA implementation.

Figure 8A:
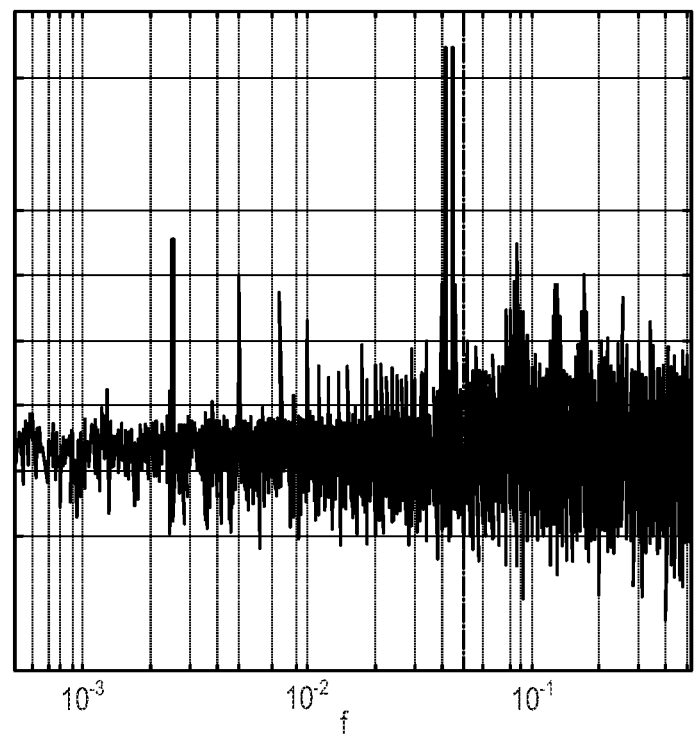
FIGS. 8A and 8B illustrate spectral plots that provide a performance comparison between an embodiment pipeline stage and a conventional pipeline stage.
Figure 8B:
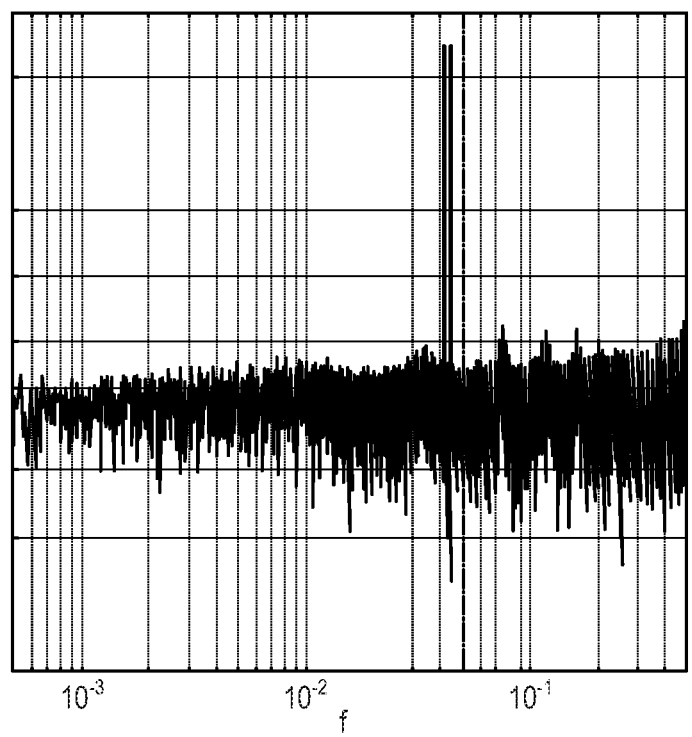

FIG. 8A depicts a spectral plot showing the worst-case simulated output for a pipeline stage that uses a thermometer-coded DAC, while FIG. 8B displays a spectral plot for the output of a pipeline stage employing the proposed DAC embodiment. Both are simulated with a two-tone input. Although the IBN+D may be comparable between the two plots, the output spectrum of the pipeline stage with the thermometer-coded DAC exhibits a predominance of harmonic content. In contrast, the output spectrum of the pipeline stage featuring the DAC embodiment displays a nearly white noise floor. As a result, embodiment pipeline stages described herein may offer improved performance within a more compact and less complicated circuit.

Figure 9:
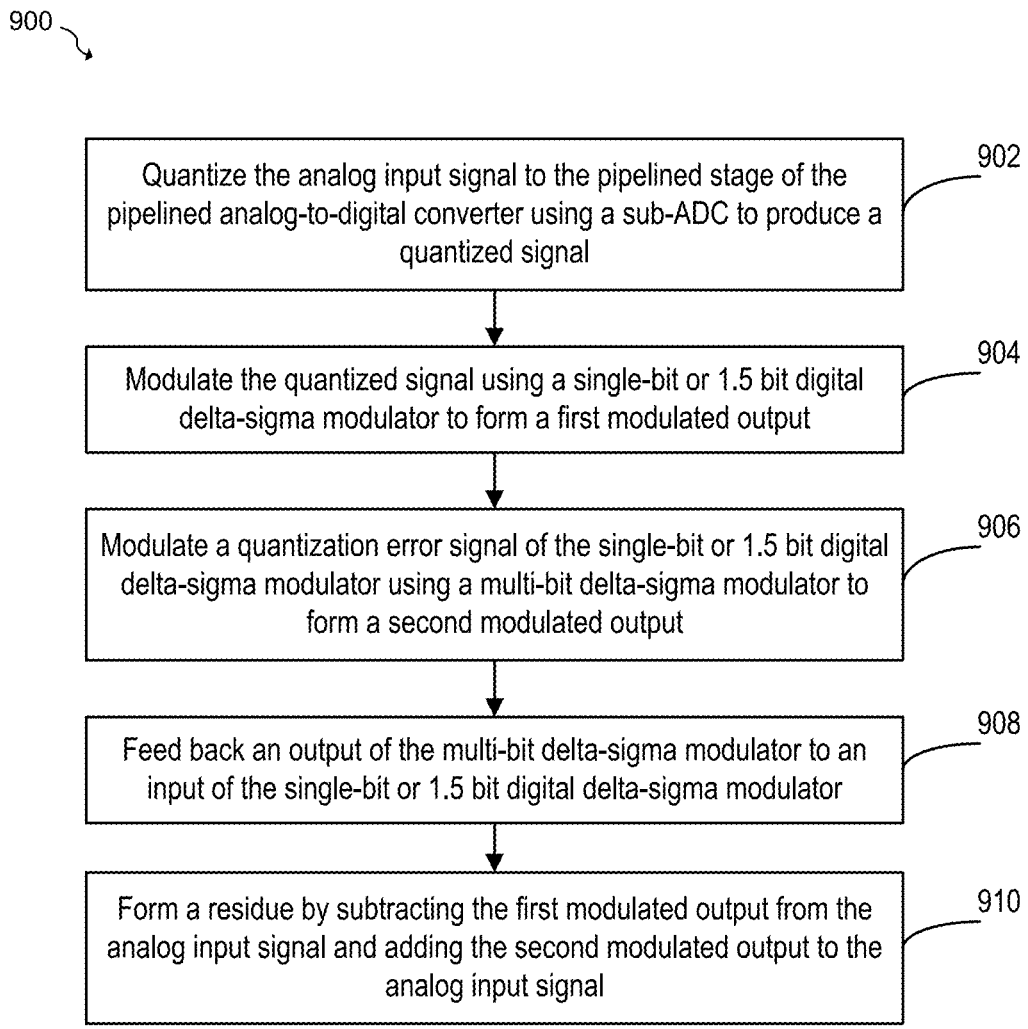
FIG. 9 illustrates a flowchart of a method of operating a pipelined ADC according to an embodiment.

FIG. 9 illustrates a flowchart of a method 900 of operating a pipelined ADC. In step 902, an analog input to a pipeline stage is quantized using a sub-ADC, such as sub-ADC 522 illustrated in FIG. 5B, to produce a quantized signal. In step 904, the quantized signal is modulated using a 1-bit or 1.5-bit delta-sigma modulator to form a first modulated signal. This step may be implemented, for example, using 1-bit or 1.5-bit DSM 526 illustrated in FIG. 5B. In step 906, a quantization error signal of the 1-bit or 1.5-bit digital delta-sigma modulator is modulated using a multi-bit delta-sigma modulator to form a second modulated output. This step may be implemented, for example using multi-bit DSM 528 illustrated in FIG. 5B. In step 908, an output of the multi-bit delta-sigma modulator is fed back to an input of the 1-bit or 1.5-bit digital delta-sigma modulator. Step 910 includes forming a residue by subtracting the first modulated output from the analog input signal and adding the second modulated output to the analog input signal. This may be accomplished, for example, by using DACs 530 and 532 illustrated in FIG. 5B.

Embodiments of the present invention are summarized here. Other embodiments can also be understood from the entirety of the specification and the claims filed herein.

Example 1. A continuous-time delta-sigma analog-to-digital converter (ADC) including: a continuous-time loop filter having an input coupled to an input of the continuous-time delta-sigma ADC; a multi-bit quantizer coupled to an output of the continuous-time loop filter; a 1-bit or 1.5 bit digital delta-sigma modulator having an input coupled to an output of the multi-bit quantizer and an output coupled to an input of the continuous-time loop filter; and a multi-bit digital delta-sigma modulator configured to requantize quantization error of the 1-bit or 1.5-bit digital delta-sigma modulator and having an output coupled to the input of the continuous-time loop filter and to an input of the 1-bit or 1.5-bit digital delta-sigma modulator.

Example 2. The continuous-time delta-sigma ADC of example 1, where the 1-bit or 1.5-bit digital delta-sigma modulator and the multi-bit digital delta-sigma modulator each includes a second order modulator.

Example 3. The continuous-time delta-sigma ADC of one of examples 1 or 2, further including: a first digital-to-analog converter coupled between the output of the 1-bit or 1.5-bit digital delta-sigma modulator and the input of the continuous-time loop filter; and a second digital-to-analog converter coupled between the output of the multi-bit digital delta-sigma modulator and the input of the continuous-time loop filter.

Example 4. The continuous-time delta-sigma ADC of example 3, where the second digital-to-analog converter includes a finite impulse response filter (FIR) coupled to a plurality of digital-to-analog converters.

Example 5. The continuous-time delta-sigma ADC of one of examples 1 to 4, where: the 1-bit or 1.5-bit digital delta-sigma modulator includes a 1-bit or 1.5-bit quantizer; and the continuous-time delta-sigma ADC further includes a first subtractor having a first input coupled to an input of the 1-bit or 1.5-bit quantizer, and second input coupled to an output of the 1-bit or 1.5-bit quantizer, and an output coupled to an input of the multi-bit digital delta-sigma modulator.

Example 6. The continuous-time delta-sigma ADC of example 5, where the 1-bit or 1.5-bit digital delta-sigma modulator includes a second subtractor having a first input coupled to an output of the 1-bit or 1.5-bit quantizer, a second input coupled to an output of the multi-bit digital delta-sigma modulator, and an output coupled to an input of a loop filter of the 1-bit or 1.5-bit digital delta-sigma modulator.

Example 7. The continuous-time delta-sigma ADC of one of examples 1 to 6, where the continuous-time loop filter includes a plurality of continuous-time integrators.

Example 8. The continuous-time delta-sigma ADC of example 7, where the continuous-time delta-sigma ADC includes a cascade of integrators with distributed feedback (CIFB) structure.

Example 9. The continuous-time delta-sigma ADC of one of examples 7 or 8, further including a decimation filter coupled to the output of the multi-bit quantizer.

Example 10. A method of operating a continuous-time delta-sigma analog-to-digital converter (ADC), the method including: filtering an analog input signal using a continuous-time loop filter; quantizing an output of the continuous-time loop filter using a multi-bit quantizer to form a quantized signal; feeding back the quantized signal to an input of the continuous-time loop filter via a 1-bit or 1.5-bit digital delta-sigma modulator; subtracting a quantization error of the 1-bit or 1.5-bit digital delta-sigma modulator from the input of the continuous-time loop filter using a multi-bit digital delta-sigma modulator; and feeding back an output of the multi-bit digital delta-sigma modulator to an input of the 1-bit or 1.5-bit digital delta-sigma modulator.

Example 11. The method of example 10, further including: converting an output of the 1-bit or 1.5-bit digital delta-sigma modulator from a first digital signal to a first analog signal using a first digital-to-analog converter; and converting an output of the multi-bit digital delta-sigma modulator from a second digital signal to a second analog signal using a second digital-to-analog converter.

Example 12. The method of one of examples 10 or 11, where subtracting the quantization error of the 1-bit or 1.5-bit digital delta-sigma modulator from the input of the continuous-time loop filter using the multi-bit digital delta-sigma modulator includes: determining a difference between an output of a 1-bit or 1.5-bit quantizer of the 1-bit or 1.5-bit digital delta-sigma modulator and on input of the 1-bit or 1.5-bit quantizer to form a first difference signal; and modulating the first difference signal using the multi-bit digital delta-sigma modulator.

Example 13. The method of example 12, where feeding back the output of the multi-bit digital delta-sigma modulator to the input of the 1-bit or 1.5-bit digital delta-sigma modulator includes: determining a difference between an output of the multi-bit digital delta-sigma modulator from an output of the 1-bit or 1.5-bit quantizer of the 1-bit or 1.5-bit digital delta-sigma modulator to form a second difference signal; and providing the second difference signal to an input of a loop filter of the 1-bit or 1.5-bit digital delta-sigma modulator.

Example 14. The method of one of examples 10 to 13, where filtering the analog input signal using the continuous-time loop filter includes integrating the analog input signal using a plurality of integrators.

Example 15. The method of example 14, further including feeding back the quantized signal to respective inputs of the plurality of integrators.

Example 16. The method of one of examples 10 to 15, further including decimating the output of the multi-bit quantizer using a decimation filter.

Example 17. A circuit including: a delta-sigma modulator disposed on a monolithic semiconductor substrate, the delta-sigma modulator including: an analog loop filter having an input coupled to an analog input node, a quantizer coupled to an output of the analog loop filter, and a sturdy multi-stage noise shaping digital-to-analog converter (DAC) coupled between an output of the quantizer and the input of the analog loop filter; and a functional circuit disposed on the monolithic semiconductor substrate and coupled to an output of the delta-sigma modulator.

Example 18. The circuit of example 17, where the sturdy multi-stage noise DAC includes: a 1-bit or 1.5-bit digital delta-sigma modulator; a multi-bit digital delta-sigma modulator configured to modulator a quantization error of the 1-bit or 1.5-bit digital delta-sigma modulator; and a feedback path coupled between an output of the multi-bit digital delta-sigma modulator and an input of the 1-bit or 1.5-bit digital delta-sigma modulator.

Example 19. The circuit of example 18, further including a finite input response (FIR) digital to analog converter coupled between the output of the multi-bit digital delta-sigma modulator and the input of the analog loop filter.

Example 20. The circuit of one of examples 17 to 19, where the analog loop filter includes a continuous-time loop filter.

Example 21. A pipelined analog-to-digital converter (ADC) including: a pipelined stage including: a sub-ADC coupled to an input of the pipelined stage; and a forward path coupled to an output of the sub-ADC; and a sub-digital-to-analog converter (sub-DAC) coupled to an output of the sub-ADC, the sub-DAC including: a 1-bit or 1.5-bit digital delta-sigma modulator having an input coupled to an output of the sub-ADC and an output coupled to the forward path, and a multi-bit digital delta-sigma modulator configured to convert a quantization error of the 1-bit or 1.5-bit digital delta-sigma modulator and having an output coupled to the output of the forward path and to the input of the 1-bit or 1.5-bit digital delta-sigma modulator.

Example 22. The pipelined ADC of example 21, where: the 1-bit or 1.5-bit digital delta-sigma modulator includes a first loop filter and a 1-bit or 1.5-bit quantizer coupled to an output of the first loop filter; the multi-bit digital delta-sigma modulator includes a second loop filter and a multi-bit quantizer coupled to an output of second loop filter; and the sub-DAC further includes a summer having a first input coupled to an output of the multi-bit quantizer, a second input coupled to an output of the 1-bit or 1.5-bit quantizer, and an output coupled to an input of the first loop filter.

Example 23. The pipelined ADC of example 22, further including a deterministic dithering circuit coupled between an input of the 1-bit or 1.5-bit quantizer and an input to the multi-bit digital delta-sigma modulator.

Example 24. The pipelined ADC of one of examples 21 to 23, where: the 1-bit or 1.5-bit digital delta-sigma modulator is a zeroth order modulator including a 1-bit or 1.5-bit quantizer; the multi-bit digital delta-sigma modulator is a zeroth order modulator including a multi-bit quantizer; and the sub-DAC further includes: a summer having a first input coupled to an output of the multi-bit quantizer, a second input coupled to an output of the 1-bit or 1.5-bit quantizer, and an output coupled to an input of the 1-bit or 1.5-bit digital delta-sigma modulator, and a deterministic dithering circuit coupled between an input of the 1-bit or 1.5-bit quantizer and an input to the multi-bit digital delta-sigma modulator.

Example 25. The pipelined ADC of example 24, further including a compensation filter coupled between the output of the multi-bit quantizer and the summer, the compensation filter configured to compensate for an effect of the deterministic dithering circuit.

Example 26. The pipelined ADC of one of examples 21 to 25, where the sub-DAC further includes: a first finite impulse response (FIR) DAC coupled between the output of the 1-bit or 1.5-bit digital delta-sigma modulator and the output of the forward path; and a second FIR-DAC coupled between the output of the multi-bit digital delta-sigma modulator and the output of the forward path.

Example 27. The pipelined ADC of one of examples 21 to 26, further including an inter-stage gain stage coupled to an output of the forward path: a subtraction circuit having inputs coupled to outputs of the 1-bit or 1.5-bit digital delta-sigma modulator and the multi-bit digital delta-sigma modulator; and a noise cancellation filter coupled to an output of the subtraction circuit, where an output of the noise cancellation filter is configured to provide a digital output of the pipelined analog-to-digital converter.

Example 28. The pipelined ADC of one of examples 21 to 27, where the forward path includes a continuous-time allpass filter.

Example 29. A method of operating a pipelined analog-to-digital converter (ADC), the method including processing an analog input signal using a pipelined stage, processing the analog input signal including: quantizing the analog input signal to the pipelined stage of the pipelined analog-to-digital converter using a sub-ADC to produce a quantized signal; modulating the quantized signal using a 1-bit or 1.5-bit digital delta-sigma modulator to form a first modulated output; modulating a quantization error signal of the 1-bit or 1.5-bit digital delta-sigma modulator using a multibit delta-sigma modulator to form a second modulated output; feeding back an output of the multi-bit delta-sigma modulator to an input of the 1-bit or 1.5-bit digital delta-sigma modulator; and forming a residue including subtracting the first modulated output from the analog input signal and adding the second modulated output to the analog input signal.

Example 30. The method of example 29, further including filtering the analog input signal using a continuous-time filter before forming the residue.

Example 31. The method of one of examples 29 or 30, where: the 1-bit or 1.5-bit digital delta-sigma modulator includes a first loop filter and a 1-bit or 1.5-bit quantizer coupled to an output of the first loop filter; and the multi-bit digital delta-sigma modulator includes a second loop filter and a multi-bit quantizer coupled to an output of second loop filter.

Example 32. The method of example 31, where processing the analog input signal using the pipelined stage further includes: forming a deterministic dithering signal based on the output of the 1-bit or 1.5-bit delta-sigma modulator; and summing the deterministic dither signal with an input of the 1-bit or 1.5-bit quantizer.

Example 33. The method of example 32, where forming the deterministic dithering signal includes delaying the quantization error signal of the 1-bit or 1.5-bit digital delta-sigma modulator to form the deterministic dithering signal.

Example 34. The method of one of examples 29 to 33, where: the 1-bit or 1.5-bit digital delta-sigma modulator is a zeroth order modulator including a 1-bit or 1.5-bit quantizer; the multi-bit digital delta-sigma modulator is a zeroth order modulator including a multi-bit quantizer; and processing the analog input signal using the pipelined stage further includes: forming the quantization error signal by subtracting an input of the 1-bit or 1.5-bit quantizer from an output of the 1-bit or 1.5-bit digital delta-sigma modulator sampling the quantization error signal to form a dither signal; and summing the dither signal with an input of the 1-bit or 1.5-bit quantizer.

Example 35. The method of one of examples 29 to 34, further including: amplifying the residue; processing the amplified residue using at least one further pipelined stage or a further ADC; and determining an output code based on the first modulated output and the second modulated output of the pipelined stage and the at least one further pipelined stage or the further ADC.

Example 36. A continuous-time pipelined analog-to-digital converter (ADC) including: at least one pipelined stage disposed on a monolithic semiconductor substrate, the at least one pipelined stage including: a sub-ADC configured to receive an analog input signal of the at least one pipelined stage, a summer configured to receive the analog input signal, a sturdy multi-stage noise shaping digital-to-analog converter (DAC) coupled between an output of the sub-ADC and the summer, and an amplifier coupled to an output of the summer; an output decoder disposed on the substrate and coupled to outputs of the sturdy multi-stage noise shaping DAC of the at least one pipelined stage, the output decoder configured to provide an output code of the continuous-time pipelined ADC at an ADC output; and a functional circuit disposed on the substrate and coupled to the ADC output.

Example 37. The continuous-time pipelined ADC of example 36, further including a continuous-time filter configured to filter the analog input signal and provide the filtered analog input signal to the summer.

Example 38. The continuous-time pipelined ADC of example 37, where the continuous-time filter is an all-pass filter.

Example 39. The continuous-time pipelined ADC of one of examples 36 to 38, where the sturdy multi-stage noise shaping DAC includes: a 1-bit or 1.5-bit digital delta-sigma modulator coupled to a first input of the summer; and a multi-bit digital delta-sigma modulator coupled to second input of the summer, where an output of a multi-bit quantizer of the multi-bit digital delta-sigma modulator is coupled to an input of the 1-bit or 1.5-bit digital delta-sigma modulator.

Example 40. The continuous-time pipelined ADC of example 39, where: the 1-bit or 1.5-bit digital delta-sigma modulator is a zeroth order modulator including a 1-bit or 1.5-bit quantizer; the multi-bit digital delta-sigma modulator is a zeroth order modulator including the multi-bit quantizer; and sturdy multi-stage noise shaping DAC further includes: a summing circuit having a first input coupled to an output of the multi-bit quantizer, a second input coupled to an output of the 1-bit or 1.5-bit quantizer, and an output coupled to an input of the 1-bit or 1.5-bit digital delta-sigma modulator, and a deterministic dithering circuit coupled between an input of the 1-bit or 1.5-bit quantizer and an input to the multi-bit digital delta-sigma modulator.

Example 41. The continuous-time pipelined ADC of one of examples 39 or 40, where the sturdy multi-stage noise shaping DAC further includes: a first finite impulse response (FIR) DAC coupled between the output of the 1-bit or 1.5-bit digital delta-sigma modulator and the first input of the summer; and a second FIR-DAC coupled between the output of the multi-bit digital delta-sigma modulator and the second input of the summer.

Example 42. A pipelined analog-to-digital converter (ADC) including: a pipelined stage including: a sub-ADC coupled to an input of the pipelined stage; and a forward path coupled to an output of the sub-ADC; a sub-digital-to-analog converter (sub-DAC) coupled to an output of the sub-ADC, the sub-DAC including: a 1-bit or 1.5-bit digital delta-sigma modulator having an input coupled to an output of the sub-ADC; a 1-bit or 1.5-bit digital-to-analog converter (DAC) coupled between a first output of the 1-bit or 1.5-bit digital delta-sigma modulator and the forward path; and a multi-bit DAC coupled between a quantization error output of the 1-bit or 1.5-bit digital delta-sigma modulator and the forward path.

Example 43. The pipelined ADC of example 42, where the 1-bit or 1.5-bit digital delta-sigma modulator includes: a first subtraction circuit having a first input coupled to the output of the sub-ADC; a 1-bit or 1.5-bit quantizer having an input coupled to an output of the first subtraction circuit; a second subtraction circuit having a first input coupled to the input of the 1-bit or 1.5-bit quantizer, a second input coupled to an output of the 1-bit or 1.5-bit quantizer, and an output coupled to the quantization error output; and a delay circuit having an input coupled to the quantization error output and an output coupled to a second input of the first subtraction circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A continuous-time delta-sigma analog-to-digital converter (ADC) comprising:
   a continuous-time loop filter having an input coupled to an input of the continuous-time delta-sigma ADC;
   a multi-bit quantizer coupled to an output of the continuous-time loop filter;
   a 1-bit or 1.5-bit digital delta-sigma modulator having a first input coupled to an output of the multi-bit quantizer and an output coupled to an input of the continuous-time loop filter; and
   a multi-bit digital delta-sigma modulator configured to requantize quantization error of the 1-bit or 1.5-bit digital delta-sigma modulator and having an output coupled to the input of the continuous-time loop filter and to an input of the 1-bit or 1.5-bit digital delta-sigma modulator, wherein the output of the multi-bit digital delta-sigma modulator is configured to provide digital values to the input of the 1-bit or 1.5-bit digital delta-sigma modulator via an all digital feedback path.

2. The continuous-time delta-sigma ADC of claim 1, wherein the 1-bit or 1.5-bit digital delta-sigma modulator and the multi-bit digital delta-sigma modulator each comprises a second order modulator.

3. The continuous-time delta-sigma ADC of claim 1, further comprising:
   a first digital-to-analog converter coupled between the output of the 1-bit or 1.5-bit digital delta-sigma modulator and the input of the continuous-time loop filter; and
   a second digital-to-analog converter coupled between the output of the multi-bit digital delta-sigma modulator and the input of the continuous-time loop filter.

4. The continuous-time delta-sigma ADC of claim 3, wherein the second digital-to-analog converter comprises a finite impulse response (FIR) filter coupled to a plurality of digital-to-analog converters.

5. The continuous-time delta-sigma ADC of claim 1, wherein:
   the 1-bit or 1.5-bit digital delta-sigma modulator comprises a 1-bit or 1.5-bit quantizer; and
   the continuous-time delta-sigma ADC further comprises a first subtractor having a first input coupled to an input of the 1-bit or 1.5-bit quantizer, and a second input coupled to an output of the 1-bit or 1.5-bit quantizer, and an output coupled to an input of the multi-bit digital delta-sigma modulator.

6. The continuous-time delta-sigma ADC of claim 5, wherein the 1-bit or 1.5-bit digital delta-sigma modulator comprises a second subtractor having a first input coupled to the output of the 1-bit or 1.5-bit quantizer, a second input coupled to an output of the multi-bit digital delta-sigma modulator, and an output coupled to an input of a loop filter of the 1-bit or 1.5-bit digital delta-sigma modulator.

7. The continuous-time delta-sigma ADC of claim 1, wherein the continuous-time loop filter comprises a plurality of continuous-time integrators.

8. The continuous-time delta-sigma ADC of claim 7, wherein the continuous-time delta-sigma ADC comprises a cascade of integrators with distributed feedback (CIFB) structure.

9. The continuous-time delta-sigma ADC of claim 7, further comprising a decimation filter coupled to the output of the multi-bit quantizer.

10. A method of operating a continuous-time delta-sigma analog-to-digital converter (ADC), the method comprising:
    filtering an analog input signal using a continuous-time loop filter;
    quantizing an output of the continuous-time loop filter using a multi-bit quantizer to form a quantized signal;
    feeding back the quantized signal to an input of the continuous-time loop filter via a 1-bit or 1.5-bit digital delta-sigma modulator;
    subtracting a quantization error of the 1-bit or 1.5-bit digital delta-sigma modulator from the input of the continuous-time loop filter using a multi-bit digital delta-sigma modulator; and
    feeding back a digital signal from an output of the multi-bit digital delta-sigma modulator to an input of the 1-bit or 1.5-bit digital delta-sigma modulator via an all digital feedback path.

11. The method of claim 10, further comprising:
    converting an output of the 1-bit or 1.5-bit digital delta-sigma modulator from a first digital signal to a first analog signal using a first digital-to-analog converter; and
    converting the output of the multi-bit digital delta-sigma modulator from the digital signal to a second analog signal using a second digital-to-analog converter.

12. The method of claim 10, wherein subtracting the quantization error of the 1-bit or 1.5-bit digital delta-sigma modulator from the input of the continuous-time loop filter using the multi-bit digital delta-sigma modulator comprises:
    determining a difference between an output of a 1-bit or 1.5-bit quantizer of the 1-bit or 1.5-bit digital delta-sigma modulator and an input of the 1-bit or 1.5-bit quantizer to form a first difference signal; and
    modulating the first difference signal using the multi-bit digital delta-sigma modulator.

13. The method of claim 12, wherein feeding back the digital signal output from the output of the multi-bit digital delta-sigma modulator to the input of the 1-bit or 1.5-bit digital delta-sigma modulator comprises:
    determining a difference between the digital signal output from the multi-bit digital delta-sigma modulator and the output of the 1-bit or 1.5-bit quantizer of the 1-bit or 1.5-bit digital delta-sigma modulator to form a second difference signal; and
    providing the second difference signal to an input of a loop filter of the 1-bit or 1.5-bit digital delta-sigma modulator.

14. The method of claim 10, wherein filtering the analog input signal using the continuous-time loop filter comprises integrating the analog input signal using a plurality of integrators.

15. The method of claim 14, further comprising feeding back the quantized signal to respective inputs of the plurality of integrators.

16. The method of claim 10, further comprising decimating the quantized signal using a decimation filter.

17. A circuit comprising:
    a delta-sigma modulator disposed on a monolithic semiconductor substrate, the delta-sigma modulator comprising:
    an analog loop filter having an input coupled to an analog input node,
    a quantizer coupled to an output of the analog loop filter, and
    a sturdy multi-stage noise shaping digital-to-analog converter (DAC) coupled between an output of the quantizer and the input of the analog loop filter, the sturdy multi-stage noise shaping DAC comprising a 1-bit or 1.5-bit digital delta-sigma modulator, a multi-bit digital delta-sigma modulator configured to modulate a quantization error of the 1-bit or 1.5-bit digital delta-sigma modulator, and an all digital feedback path configured to route a digital signal at a digital output of the multi-bit digital delta-sigma modulator to a digital input of the 1-bit or 1.5-bit digital delta-sigma modulator; and a functional circuit disposed on the monolithic semiconductor substrate and coupled to an output of the delta-sigma modulator.

18. The circuit of claim 17, further comprising a first finite impulse response (FIR) digital to analog converter coupled between the output of the multi-bit digital delta-sigma modulator and the input of the analog loop filter.

19. The circuit of claim 17, wherein the analog loop filter comprises a continuous-time loop filter.

20. The circuit of claim 18, further comprising a second FIR digital to analog converter coupled between an output of the 1-bit or 1.5-bit digital delta-sigma modulator and the input of the analog loop filter.

* * * * *